United States Patent
Baliga

(10) Patent No.: US 12,094,932 B2
(45) Date of Patent: Sep. 17, 2024

(54) POWER DEVICES HAVING TUNABLE SATURATION CURRENT CLAMPS THEREIN THAT SUPPORT IMPROVED SHORT-CIRCUIT CAPABILITY

(71) Applicant: North Carolina State University, Raleigh, NC (US)

(72) Inventor: Bantval Jayant Baliga, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 504 days.

(21) Appl. No.: 17/418,309

(22) PCT Filed: Feb. 13, 2020

(86) PCT No.: PCT/US2020/018027
§ 371 (c)(1),
(2) Date: Jun. 25, 2021

(87) PCT Pub. No.: WO2020/172031
PCT Pub. Date: Aug. 27, 2020

(65) Prior Publication Data
US 2022/0085171 A1    Mar. 17, 2022

Related U.S. Application Data

(60) Provisional application No. 62/858,145, filed on Jun. 6, 2019, provisional application No. 62/808,451, filed on Feb. 21, 2019.

(51) Int. Cl.
*H01L 29/16*    (2006.01)
*H01L 29/73*    (2006.01)
(Continued)

(52) U.S. Cl.
CPC ...... *H01L 29/1608* (2013.01); *H01L 29/7397* (2013.01); *H01L 29/7813* (2013.01);
(Continued)

(58) Field of Classification Search
CPC ............ H01L 29/2623; H01L 29/1608; H01L 29/1095; H01L 29/7395; H01L 29/42312;
(Continued)

(56) References Cited

U.S. PATENT DOCUMENTS 5,396,085 A    3/1995  Baliga
5,912,497 A    6/1999  Baliga
(Continued)

FOREIGN PATENT DOCUMENTS

EP    1041634 A1    10/2000
EP    0808027 B1    12/2004

OTHER PUBLICATIONS

Hatta et al. "Suppression of Short-Circuit Current with Embedded Source Resistance in SiC-MOSFET" Materials Science Forum 924:727-730 (2017).
(Continued)

*Primary Examiner* — Ida M Soward
(74) *Attorney, Agent, or Firm* — Myers Bigel, P.A.

(57)    ABSTRACT

A power device includes a packaged semiconductor switch containing first and second series-connected insulated-gate transistors, first and second control terminals electrically connected to the first and second insulated-gate transistors, respectively, first and second current carrying terminals electrically connected to the first and second insulated-gate transistors, respectively, and a voltage-monitoring terminal electrically connected to an internal node shared by first and second current carrying regions within the first and second insulated-gate transistors, respectively. The first and second control terminals can be electrically connected to a gate of
(Continued)

the first insulated-gate transistor and a gate of the second insulated-gate transistor, respectively; and the first and second current carrying terminals can be electrically connected to a source of the first insulated-gate transistor and a drain (or collector) of the second insulated-gate transistor. The voltage-monitoring terminal is electrically connected to a drain of the first insulated-gate transistor and a source (or emitter) of the second insulated-gate transistor.

20 Claims, 20 Drawing Sheets

(51) Int. Cl.
*H01L 29/739* (2006.01)
*H01L 29/78* (2006.01)
*H01L 29/80* (2006.01)
*H01L 29/808* (2006.01)

(52) U.S. Cl.
CPC ...... *H01L 29/7816* (2013.01); *H01L 29/8083* (2013.01); *H01L 29/7838* (2013.01)

(58) Field of Classification Search
CPC ............. H01L 29/7397; H01L 29/7813; H01L 29/7816; H01L 29/8083; H01L 29/7803; H01L 29/7838; H01L 24/06; H01L 24/48; H01L 24/49; H01L 25/18; H01L 25/072; H01L 2224/0603; H01L 2224/48247; H01L 2224/732654; H01L 2924/00014; H01L 2924/10253; H01L 2924/10272; H01L 2924/13091
See application file for complete search history.

(56) References Cited

U.S. PATENT DOCUMENTS

| | | | |
|---|---|---|---|
| 6,649,975 B2 | 11/2003 | Baliga | |
| 6,764,889 B2 | 7/2004 | Baliga | |
| 6,791,143 B2 | 9/2004 | Baliga | |
| 7,041,559 B2 | 5/2006 | Baliga | |
| 9,190,993 B1* | 11/2015 | Li | H03K 17/102 |
| 9,793,352 B1 | 10/2017 | Seok et al. | |
| 10,734,911 B2* | 8/2020 | Miyazaki | H01L 24/41 |
| 2004/0070910 A1 | 4/2004 | Gergintschew | |
| 2012/0275212 A1* | 11/2012 | Jung | G11C 7/14 |
| | | | 365/189.15 |
| 2014/0091324 A1* | 4/2014 | Zushi | H02M 1/08 |
| | | | 257/77 |
| 2014/0177285 A1 | 6/2014 | Disney | |
| 2018/0145007 A1* | 5/2018 | Hatano | H01L 25/115 |

OTHER PUBLICATIONS

Huang et al. "Design and Fabrication of 3.3kV SiC MOSFETs for Industrial Applications" 29th International Symposium on Power Semiconductor Devices and IC's (2017).
Noborio et al. "Experimental and Theoretical Investigations on Short-Channel Effects in 4H—SiC MOSFETs" IEEE Transactions on Electron Devices 52(9):1954-1962 (Sep. 2005).
Notification of Transmittal of the International Search Report and the Written Opinion of the International Searching Authority, or the Declaration, in corresponding PCT Application No. PCT/US2020/018027 (13 pages) (Jun. 23, 2020).

* cited by examiner

US 12,094,932 B2

POWER DEVICES HAVING TUNABLE SATURATION CURRENT CLAMPS THEREIN THAT SUPPORT IMPROVED SHORT-CIRCUIT CAPABILITY

REFERENCE TO PRIORITY APPLICATIONS

This application is a 35 U.S.C. § 371 national stage application of PCT Application No. PCT/US2020/018027, filed on Feb. 13, 2020, which itself claims priority to U.S. Provisional Application Ser. Nos. 62/858,145, filed Jun. 6, 2019, and 62/808,451, filed Feb. 21, 2019, the disclosures of which are hereby incorporated herein by reference. The above-referenced PCT Application was published as International Publication No. WO 2020/172031 A1 on Aug. 27, 2020.

FIELD OF THE INVENTION

The present invention relates to semiconductor devices and, more particularly, to power devices having semiconductor-based switches therein that support high currents in high power applications.

BACKGROUND OF THE INVENTION

Conventional semiconductor switching devices that are frequently utilized in high power switching applications to control high current loads may include wide bandgap power transistors, such as silicon carbide (SiC) power MOSFETs. As shown by FIGS. 1A-1B, a planar-gate inversion-mode SiC power MOSFET 10a having a P-type gate-controlled active region (P-BASE) and a planar-gate accumulation-mode SiC power MOSFET 10b having an N-type gate-controlled active region (N-BASE) utilize relatively highly doped P+ shielding regions within an N-type substrate containing a vertical N-type voltage-supporting drift region therein. Related power MOSFETs that utilize P+ shielding regions are disclosed in U.S. Pat. Nos. 6,791,143 and 7,041,559 to B. Jayant Baliga, the disclosures of which are hereby incorporated herein by reference.

As shown by FIG. 1C, SiC power MOSFETs 10c may also utilize trench-based gate electrodes having vertical sidewalls, which extend adjacent P-type base regions (P-BASE), and bottoms, which extend adjacent P+ shielding regions. Similarly, FIG. 1D illustrates a silicon (Si) trench-gate insulated-gate bipolar transistor (IGBT) for high power applications, which contains a P-type collector region adjacent a bottom surface of a semiconductor substrate. Related power MOSFETs and IGBTs having trench-based gate electrodes are disclosed in U.S. Pat. Nos. 5,912,497, 6,649,975 and 6,764,889 to B. Jayant Baliga, the disclosures of which are hereby incorporated herein by reference. In addition, U.S. Pat. No. 5,396,085 to B. Jayant Baliga, entitled "*Silicon Carbide Switching Device with Rectifying-Gate*," discloses, among other things, hybrid switching devices having silicon MOSFETs and silicon carbide JFETs (or MESFETs) integrated together as three-terminal hybrid devices.

The devices of FIGS. 1A-1D may be utilized in many high-power applications, including within inverters for driving motors from a DC power supply. As will be understood by those skilled in the art, it is desirable that these power devices reliably withstand extreme operating conditions, such as motor winding short circuit events. For example, if a short circuit event occurs when a SiC power MOSFET is in an on-state, then the MOSFET may be required to fully support a DC supply voltage with a current flow determined by its saturated drain current (Idsat) at the applied gate drive voltage (e.g., 20 Volts). And, because the Idsat for SiC power MOSFETs is typically about 25-times the gate-modulated on-state current value, very high power dissipation will be required, which can quickly result in permanent device failure when one or more regions within the MOSFET, including contact metallization, exceed their respective melting temperature. Unfortunately, a short-circuit withstand time (i.e., $t_{sc}$) for a conventional SiC power MOSFET is typically only a few microseconds, which is too short to allow detection of a short circuit event and subsequent shut down of the gate drive voltage prior to device failure.

The short-circuit withstand time $t_{sc}$ of a SiC power MOSFET can be increased by reducing the drain saturation current. As described in an article by X Huang et al., entitled "*Design and Fabrication of 3.3 kV SiC MOSFETs for Industrial Applications,*" 29$^{th}$ International Symposium on Power Semiconductor Devices and IC's, (2017), drain saturation current may be lowered by reducing channel density, but this can result in an unwanted increase in on-state resistance by about 56% (1.56×) for a 2× reduction in saturated drain current. Alternatively, as shown by the SiC MOSFET 20a of FIGS. 2A-2B, and described in an article by Hatta et al., entitled "Suppression of Short-Circuit Current with Embedded Source Resistance in SiC-MOSFET," ICSCRM (2017), a source resistance $R_S$ may be integrated as a more lightly doped N+ region within an N++ source region. As explained in Hatta et al. and illustrated by FIGS. 1a-1b therein, this additional embedded resistance $R_S$ (at the center of N++ source region) replaces a portion of the gate-modulated channel resistance, which typically has a strong negative temperature dependence that contributes to a shorter $t_{sc}$. The additional source resistance $R_S$ will also operate to oppose the gate drive voltage, which can result in a smaller MOSFET saturated drain current. According to Hatta et al., the MOSFET short-circuit time $t_{sc}$ can be increased by a factor of 2×, but with a 43% (1.43×) increase in on-state resistance and shorter gate-modulated channel region. The equivalent circuit for this modified MOSFET is illustrated by the electrical schematic of FIG. 2B. Unfortunately, as described in an article by M. Noborio et al., entitled "*Experimental and Theoretical Investigations on Short-Channel Effects in 4H-SiC MOSFETs,*" IEEE Transactions on Electron Devices, Vol. 52, No. 9, September (2005), pp. 1954-1962, the use of SiC MOSFETs having shorter gate-modulated channel regions, as proposed by Hatta et al., may cause an increase in many undesired short-channel effects (SCEs), such as: (i) increased punch-through susceptibility, (ii) lower threshold voltage, (iii) transconductance saturation, and (iv) deteriorated sub-threshold I-V characteristics.

SUMMARY OF THE INVENTION

A power device according to some embodiments of the invention includes a semiconductor switch having a control terminal, first and second current carrying terminals, and a saturation current clamp (SCC) electrically coupled in series between the first current carrying terminal and an active region of the semiconductor switch, which has a conductivity modulated by a control terminal bias (e.g., an applied gate voltage). The purpose of the SCC is to improve (i.e., increase) the short-circuit withstand time characteristic of the power device, which may include a silicon carbide (SiC) MOSFET, but with only a minimal increase in on-state resistance. In some embodiments of the invention, the SCC operates with a substantially non-linear resistance, which increases with increasing current level, in series with a source terminal of the MOSFET. This non-linear resistance may be provided by a "depletion mode" JFET having shorted gate and source terminals. The SCC may also be configured as a non-linear resistance, which is integrated within the MOSFET. For example, this non-linear resistance may be provided by a built-in depletion-mode JFET having an N-type "channel" region, which extends between an N+ source region and P-type (or N-type) base region and above a P+ shielding region. This depletion-mode JFET can be designed to have a very low resistance at the on-state current level of the MOSFET, and with a JFET saturation current that is typically much lower than the MOSFET saturation current at the typical on-state gate bias voltage, so that the short-circuit current is determined by the JFET saturation current instead of the MOSFET saturation current. These embodiments may allow for an increase in short-circuit withstand time ($t_{sc}$) of about 4× with an increase in on-state resistance of only about 5-8%, for example.

Thus, in some of these embodiments of the invention, the saturation current clamp (SCC) may be configured to clamp a maximum current through the semiconductor switch at a level below a maximum saturation current supported by the active region. In other embodiments of the invention, the saturation current clamp includes a depletion-mode field effect transistor, which may include a semiconductor material selected from a group consisting of silicon, silicon carbide, gallium arsenide and gallium nitride, for example. In some of these embodiments, the saturation current clamp may include a semiconductor device selected from a group consisting of depletion-mode JFETs, MESFETs and MOSFETs. The semiconductor switch may also include devices selected from a group consisting of planar-gate MOSFETs, trench-gate MOSFETs, planar-gate IGBTs, and trench-gate IGBTs. For example, the semiconductor switch may include a three-terminal device, such as planar-gate inversion-mode silicon carbide MOSFET, a planar-gate accumulation-mode silicon carbide MOSFET, a trench-gate silicon carbide MOSFET, a planar-gate silicon IGBT, or a trench-gate silicon IGBT, for example.

According to further embodiments of the invention, the saturation current clamp may be configured to clamp a maximum current through the semiconductor switch at a level between about 10% and about 70% of a maximum saturation current otherwise supported by the active region in the absence of the saturation current clamp. In some of these embodiments of the invention, the saturation current clamp may include a depletion-mode field effect transistor formed of a material selected from a group consisting of silicon, silicon carbide, gallium arsenide and gallium nitride. The field effect transistor may be selected from a group consisting of depletion-mode JFETs, depletion-mode MESFETs and depletion-mode MOSFETs, and the semiconductor switch may include a device selected from a group consisting of planar-gate MOSFETs, trench-gate MOSFETs, and planar or trench-gate IGBTs. The semiconductor switch may also be packaged as a three-terminal device with the saturation current clamp integrated within the three-terminal device. In some of these embodiments of the invention, the saturation current clamp may be configured as a two-terminal device in series with a current carrying terminal of the three-terminal device.

According to additional embodiments of the invention, the semiconductor switch within the power device may include an insulated-gate transistor having a source region of first conductive type and a base region of first or second conductivity type therein, and the saturation current clamp may be configured as a depletion-mode JFET region of first conductivity type extending in series between the source region and the base region. This insulated-gate transistor may be an insulated-gate field effect transistor or an insulated-gate bipolar transistor, and may include a planar-gate or trench-gate, for example.

A power device according to additional embodiments of the invention includes a semiconductor switch having a control terminal, first and second current carrying terminals, and a variable resistance device therein. The variable resistance device, which is electrically coupled in series between the first current carrying terminal and an active region of the semiconductor switch, has a positive and non-linear resistance versus on-state current characteristic.

A power device according to a further embodiment of the invention may include a packaged semiconductor switch configured as a three-terminal gate-modulated device in combination with a saturation current clamp that precludes the three-terminal gate-modulated device from otherwise supporting a maximum saturation current therein when turned-on in response to an above-threshold gate bias. This saturation current clamp may be configured as a field effect transistor and may include a semiconductor material selected from a group consisting of silicon, silicon carbide, gallium arsenide and gallium nitride. The field effect transistor may be configured as a depletion-mode JFET, depletion-mode MESFET or depletion-mode MOSFET (having shorted gate and source terminals), for example. In addition, the three-terminal gate-modulated device may be configured as a planar-gate inversion-mode silicon carbide MOSFET, a planar-gate accumulation-mode silicon carbide MOSFET, a trench-gate silicon carbide MOSFET, or a planar or trench-gate silicon IGBT. The saturation current clamp may also include a semiconductor clamping region of first conductivity type disposed in series between a source region of the three-terminal gate-modulated device and an active region of the three-terminal gate-modulated device. The semiconductor clamping region may form a non-rectifying junction with the source region and a P-N junction with the active region. The three-terminal gate-modulated device may also include a shielding region of second conductivity type (e.g., P+ shielding region), and the semiconductor clamping region may form a P-N junction with the shielding region.

According to still further embodiments of the invention, the three-terminal gate-modulated device and the saturation current clamp are electrically connected in series as discrete devices within a semiconductor package. And, in some of these embodiments of the invention, the saturation current clamp may be configured as a net two-terminal device, and may include a semiconductor device selected from a group consisting of depletion-mode FETs, depletion-mode MESFETs and depletion-mode MOSFETs (having shorted gate and source terminals). This net two-terminal device may have first and second current carrying terminals, and one of these current carrying terminals may be electrically connected to a current carrying terminal of the three-terminal gate-modulated device.

According to other embodiments of the invention, a method of operating a power device is provided, for a power device including a first insulated-gate transistor electrically coupled in series with a second insulated-gate transistor having a drain electrically connected to a source or emitter of the first insulated-gate transistor. This method includes modulating a conductivity of the first insulated-gate transistor during a forward on-state mode of operation concurrently with applying a first DC voltage to a gate of the second insulated-gate transistor, to thereby set a short-circuit withstand time of the first insulated-gate transistor. The first insulated-gate transistor may be selected from a group consisting of SiC MOSFETs and Si IGBTs, and the second insulated-gate transistor may be selected from a group consisting of Si depletion-mode MOSFETs and Si enhancement-mode MOSFETs. These first and second insulated-gate transistors may be packaged together within a multi-terminal package having two current carrying terminals, two control terminals and a voltage-monitoring terminal. This voltage-monitoring terminal is electrically connected to the drain of the second insulated-gate transistor and the source or emitter of the first insulated-gate transistor. In addition, the modulating step/operation may be performed concurrently with monitoring a magnitude of a voltage at the drain of the second insulated-gate transistor via the voltage-monitoring terminal, and the applying step/operation may include holding a gate-to-source voltage of the second insulated-gate transistor at a second non-zero DC voltage. In some embodiments of the invention, the first DC voltage and the second non-zero DC voltage are equivalent.

DETAILED DESCRIPTION OF EMBODIMENTS

Figures 1A, 1B:
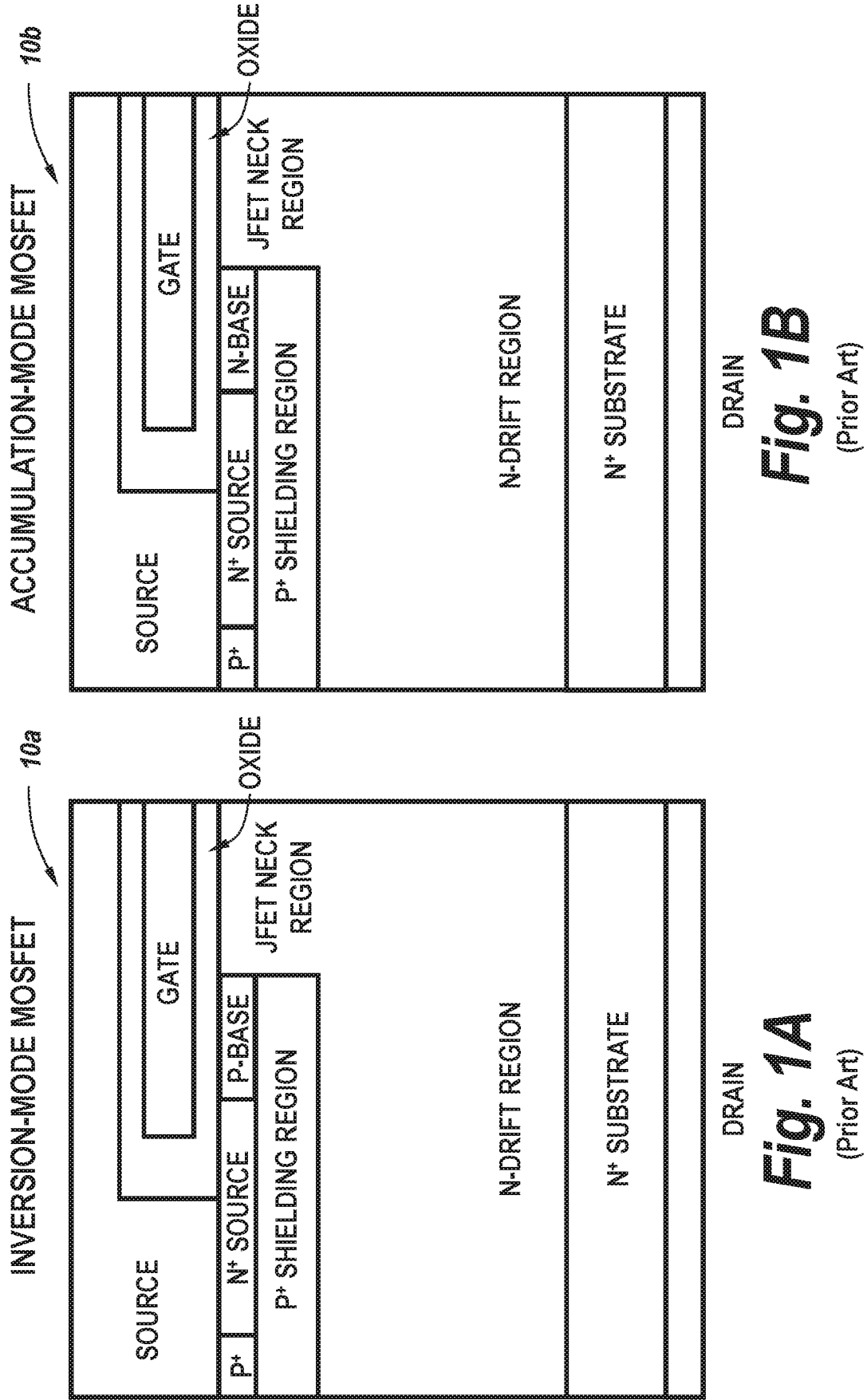
FIG. 1A is a cross-sectional view of a planar-gate MOSFET having an inversion-mode active region, according to the prior art.
FIG. 1B is a cross-sectional view of a planar-gate MOSFET having an accumulation-mode active region, according to the prior art.
Figures 1C, 1D:
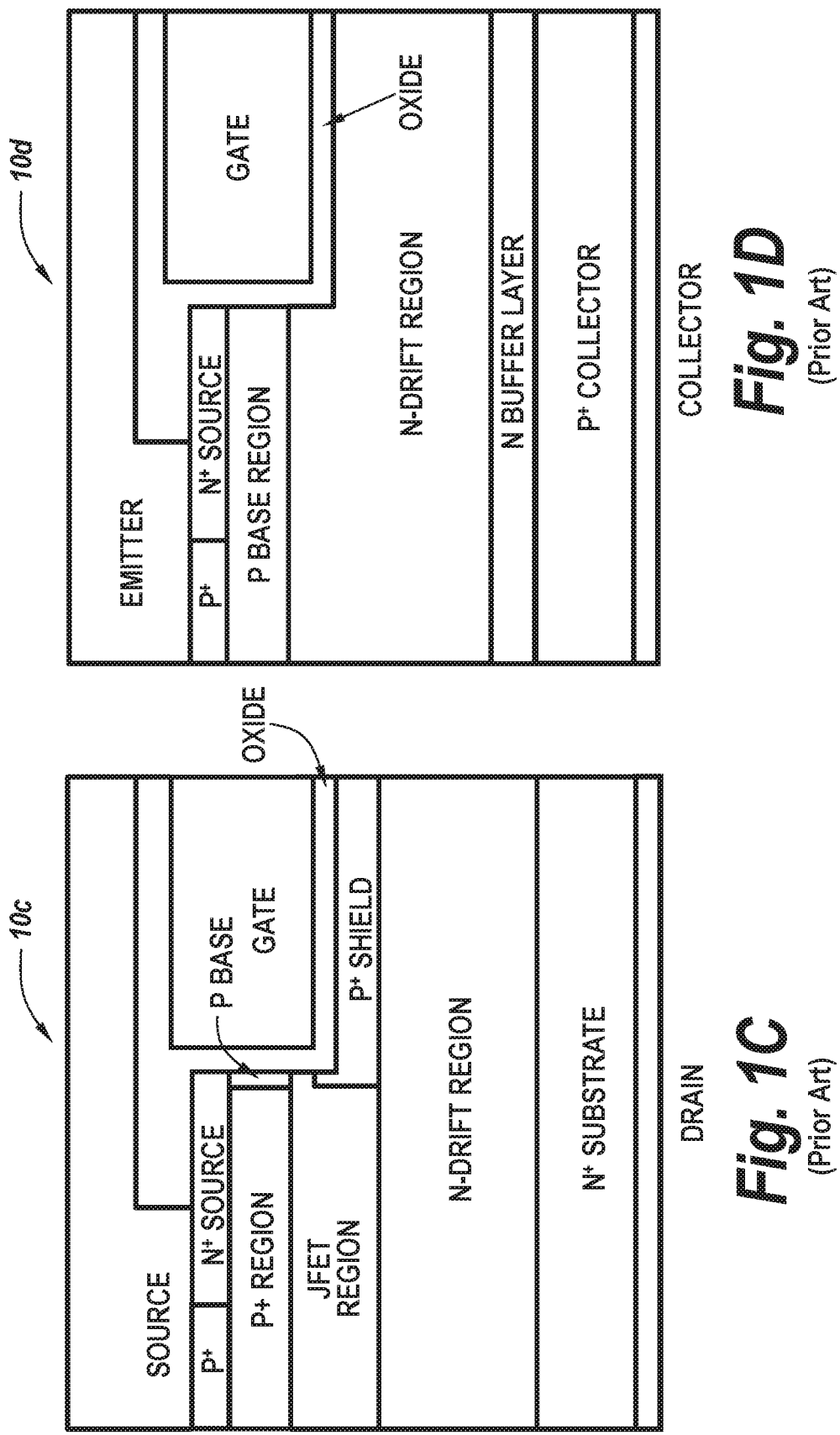
FIG. 1C is a cross-sectional view of a trench-gate MOSFET having a vertical inversion-mode active region, according to the prior art.
FIG. 1D is a cross-sectional view of a trench-gate silicon (Si) insulated-gate bipolar transistor (IGBT), according to the prior art.
Figures 2A, 2B:
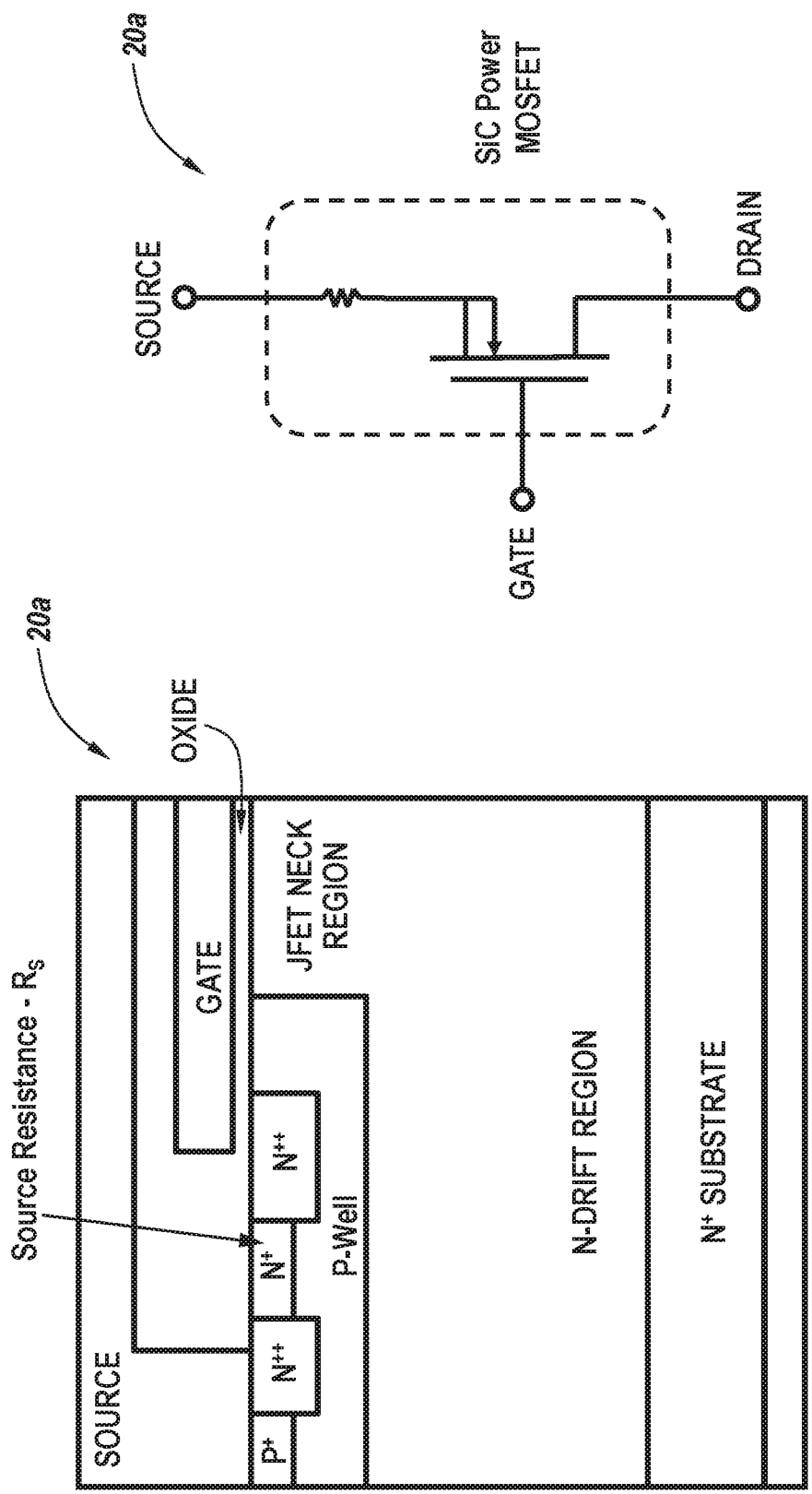
FIG. 2A is a cross-sectional view of a planar-gate MOSFET having an inversion-mode active region and an added source resistance $R_s$, according to the prior art.
FIG. 2B is an electrical schematic of the planar-gate MOSFET of FIG. 2A.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3B:
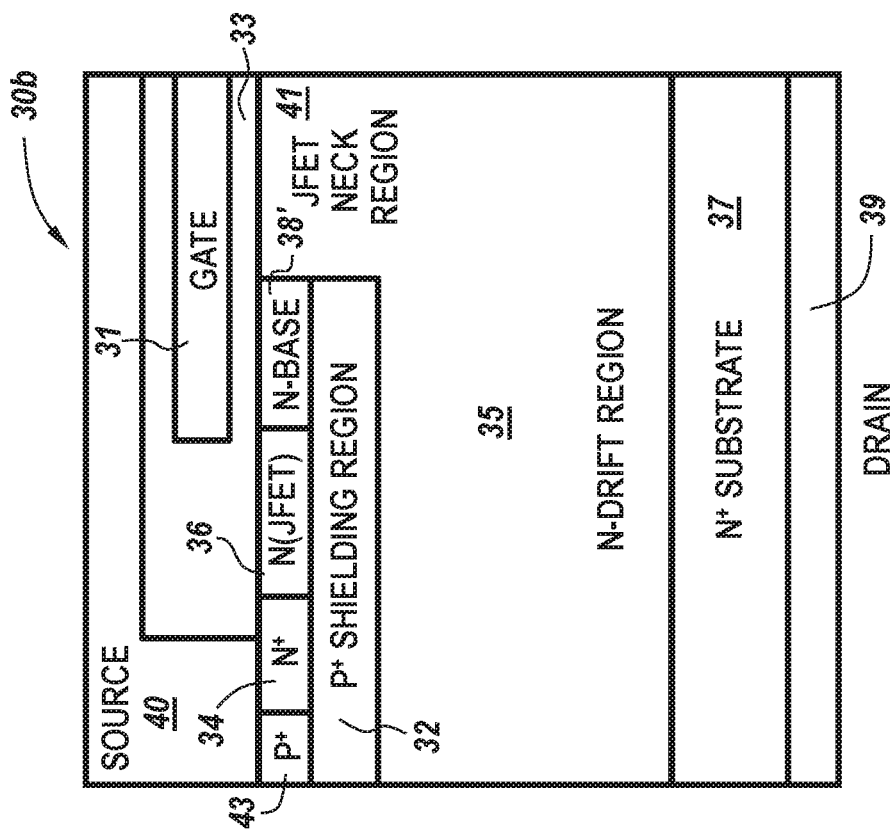
FIG. 3B is a cross-sectional view of a planar-gate MOSFET with an accumulation-mode active region and an integrated source-side JFET, according to an embodiment of the invention.
Figure 3A:
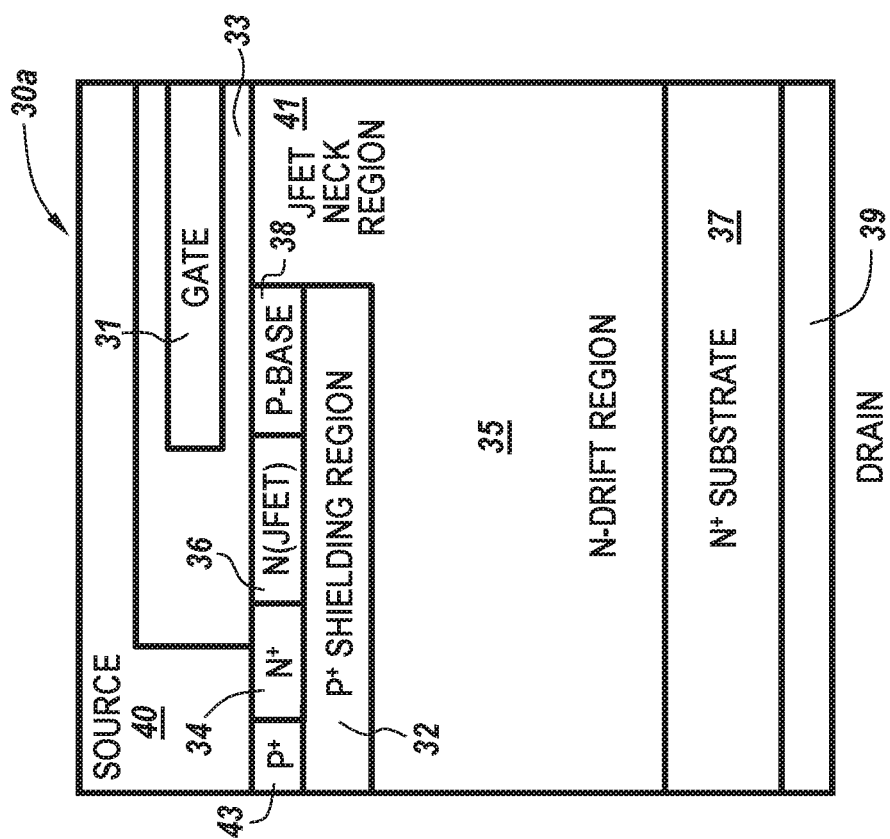
FIG. 3A is a cross-sectional view of a planar-gate MOSFET with an inversion-mode active region and an integrated source-side JFET, according to an embodiment of the invention.

Referring now to FIG. 3A, a power device 30a according to an embodiment of the invention is illustrated as including a planar-gate "inversion-mode" silicon carbide (SiC) MOSFET having a SiC depletion-mode junction field effect transistor (JFET) integrated therein, which operates advantageously as a saturation current clamp (SCC), as explained more fully hereinbelow. In the embodiment of FIG. 3A, the power device 30a is illustrated as including a planar and insulated gate defined by a planar gate electrode 31 (e.g., polysilicon gate), which is insulated from an underlying semiconductor substrate (and adjacent source electrode) by a gate insulating region 33 (e.g., gate oxide) and surrounding electrically insulating passivation layer region. As shown, this semiconductor substrate may include a vertical and voltage-supporting N-type SiC carbide drift region 35 on a more highly doped SiC drain region 37, which extends to a lower surface of the semiconductor substrate on which a drain electrode 39 (e.g., metal drain electrode) is provided. As will be understood by those skilled in the art, an upper portion of the drift region 35, which extends to an upper surface of the semiconductor substrate, may operate as a conventional JFET "neck region" 41, which extends, when viewed in cross-section, between a "left" P+ shielding region 32 and a "right" P+ shielding region (not shown) that define a full unit cell of the power device 30a. The left P+ shielding region 32 is illustrated as being electrically shorted to an upper source electrode 40 by a P+ ohmic contact region 43 extending adjacent the upper surface of the semiconductor substrate. As further illustrated by FIG. 3A, a relatively highly doped N+ source region 34, an N-type JFET region 36 and a P-type base region 38 may be provided, which extend in series between the source electrode 40 and the JFET neck region 41 when the power device 30a is disposed in a forward on-state mode of operation and a laterally-extending and vertically-extending current path is being supported by these regions.

As described herein, the P+ shielding region 32 and the N-type JFET region 36, which forms a P-N rectifying junction with the P-type base/active region 38, operate collectively as a built-in depletion-mode junction field-effect transistor (JFET) with the P+ shielding region acting as the "gate" of the JFET. This JFET is integrated within the power device 30a as a non-linear resistance that performs a saturation current clamping (SCC) function. This SCC function advantageously increases the short-circuit withstand time ($t_{sc}$) of the SiC MOSFET within the power device 30a by limiting a maximum short-circuit current supported by an inversion-layer channel within the P-type base region 38 (i.e., gate-modulated active region). In particular, and as described hereinbelow with respect to FIG. 5, upon commencement of an undesired short-circuit event, the maximum short-circuit current in the power device 30a is "clamped" at a level substantially below an otherwise predicted saturation current level of the SiC MOSFET (at the corresponding voltage on the gate electrode 31). In this manner, the built-in depletion-mode JFET operates to increase the short-circuit safe operating area (SCSOA) of the power device 30a. Moreover, through the careful design of doping concentration and thickness of the N-type JFET region 36, the resistance of the depletion-mode JFET can be designed to be substantially less than the on-state resistance of the MOSFET, so that the JFET will provide only a minimal increase in the overall specific on-resistance ($R_{on,sp}$) of the power device 30a, but will not require any reduction in the length of the gate-modulated active region to compensate for the JFET resistance.

These advantageous features of the power device 30a of FIG. 3A also apply to the power device 30b of FIG. 3B, which includes a planar-gate "accumulation-mode" silicon carbide (SiC) MOSFET and a built-in N-type JFET region 36. These devices are otherwise equivalent to the corresponding structures within the power device 30a of FIG. 3A, however, the P-type base region 38 is replaced with an N-type base region 38' that supports an accumulation-layer channel during forward on-state conduction (instead of an inversion-layer channel).

Figure 4A:
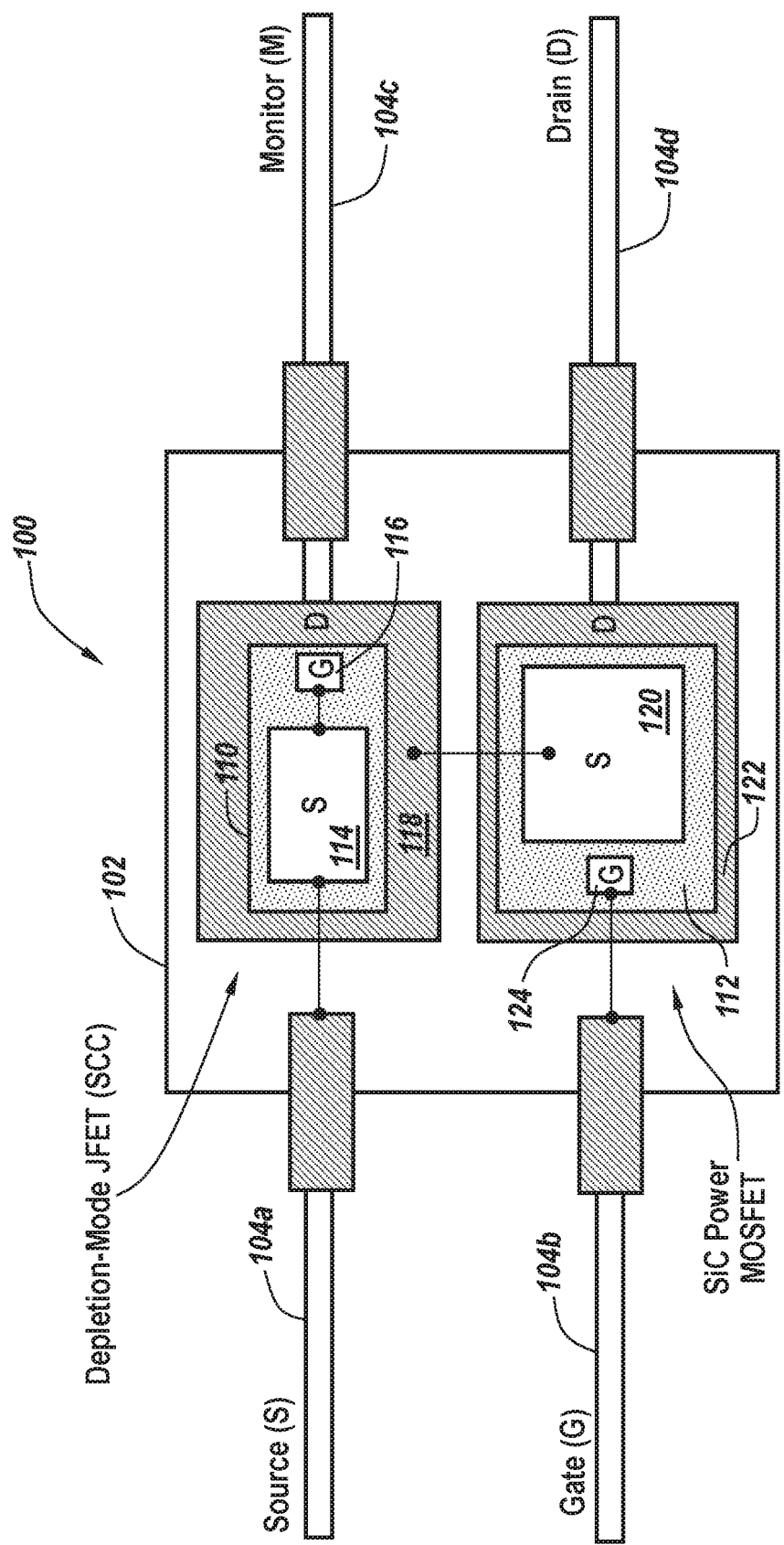
FIG. 4A is plan view of a 4-terminal packaged power device containing a silicon-carbide (SiC) power MOSFET in series with a depletion-mode JFET, according to an embodiment of the invention.
Figure 4B:
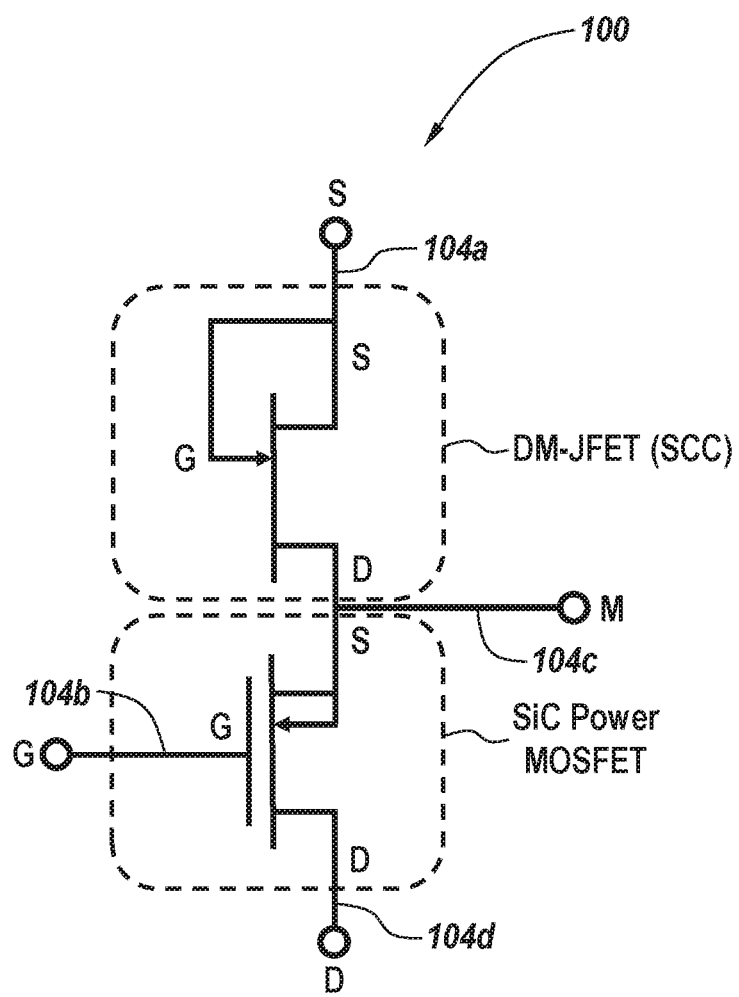
FIG. 4B is an electrical schematic of the packaged power device of FIG. 4A according to an embodiment of the invention.

Next, as shown by FIGS. 4A-4B and according to additional embodiments of the invention, a net four-terminal power device 100 may be provided using two discrete and serially-connected devices (e.g., JFET (SCC), MOSFET), which are assembled together within a semiconductor package 102. In one embodiment of the invention, the two discrete devices may be configured together to provide a power device 100 having: (i) two current carrying terminals 104a, 104d corresponding to the source (S) of the depletion-mode JFET (SCC) and drain (D) of the SiC MOSFET, (ii) one control terminal 104b corresponding to the gate (G) of the MOSFET, and (iii) one monitor terminal (M) 104c (optional), which can be utilized by external monitoring and control circuitry (not shown) to rapidly detect an occurrence of a short-circuit event. In some embodiments, a short-circuit event may be evidenced by a rapid change in a voltage at a drain-to-source interconnect between the JFET and MOSFET (i.e., the monitor terminal M).

In particular, the net four-terminal power device 100 of FIG. 4A is illustrated as a 4-terminal dual in-line package 102 containing a pair of semiconductor chips 110, 112, which are bonded to underlying drain electrodes 118, 122 within the package 102. As shown, these drain electrodes 118, 122 of the JFET and SiC MOSFET are electrically coupled on a first side of the package 102 by a first pin, which operates as a monitor terminal 104c of the device 100, and a second pin, which operates as a current-carrying drain terminal 104d of the SiC MOSFET. As further shown by FIGS. 4A-4B, the drain electrode 118 is also directly connected (i.e., shorted) to a source electrode 120 of the SiC MOSFET. In addition, the commonly-connected source and gate electrodes 114, 116 of the JFET (SCC) and the gate electrode 124 of the SiC MOSFET are electrically coupled to a second side of the package 102 by a third pin, which operates as a source terminal 104a, and a fourth pin, which operates as a control/gate terminal 104b, respectively. Furthermore, in alternative embodiments of the invention, the JFET illustrated by FIGS. 4A-4B may be replaced by a MESFET (or MOSFET) having shorted gate and source terminals.

Figure 5:
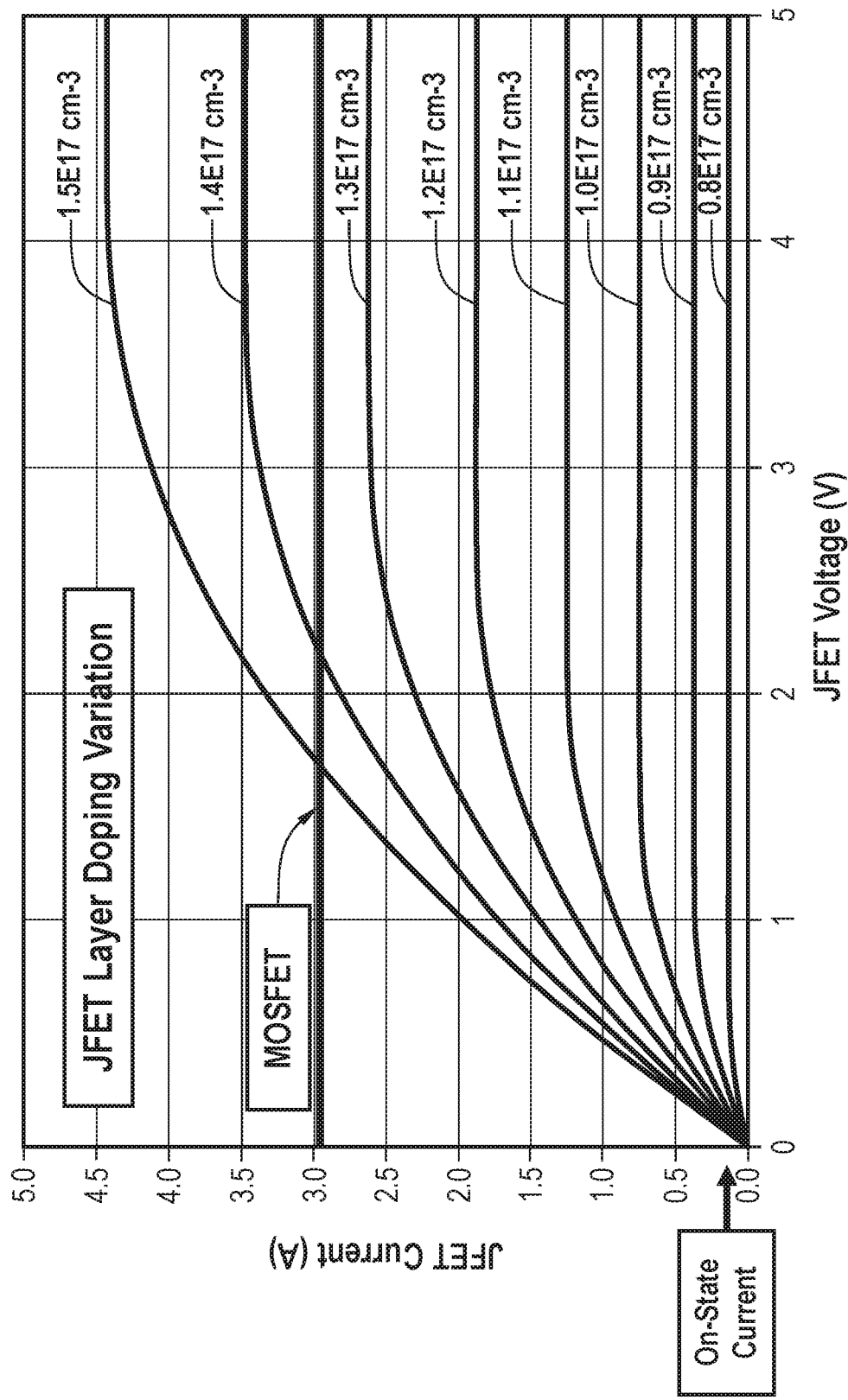
FIG. 5 is a graph illustrating I-V characteristics of an integrated SiC JFET, at various levels of JFET region doping, according to the embodiment of FIG. 3A.

FIG. 5 is a graph illustrating I-V characteristics of the integrated SiC JFET within the power device 30a of FIG. 3A, at various levels of JFET region doping. As shown, an N-type doping level in the JFET region 36 of less than about $1.3 \times 10^{17}$ cm$^{-3}$ may yield a desired saturation clamping current (i.e., JFET current), which is less than the specified saturation current of an otherwise equivalent SiC MOSFET devoid of the JFET region 36. This specified saturation level is illustrated by the horizontal line (at 3 Amps) in FIG. 5. Preferably, the JFET region 36 of the depletion-mode JFET is designed so that its saturation current is much smaller (e.g., 2-10× smaller) than that of the SiC MOSFET, so that under short circuit conditions, the current flowing in the drain of the power device 30a becomes limited by the JFET region 36 operating in saturation at a relatively low current level. For example, according to some embodiments of the invention, the integrated depletion-mode JFET may operate as a built-in saturation current clamp that limits a maximum current through the semiconductor switch at a level between about 10% and about 70% of a maximum saturation current otherwise supported by the active region of the SiC MOSFET in the absence of the JFET region 36.

In particular, when the power device 30a is operating within a circuit (e.g., inductive load circuit) and becomes exposed to a short circuit event, the increasing levels of current flowing in the drain of the power device 30a will cause an increasing voltage drop along the JFET region 36, and an increasing reverse bias across the N(JFET)/P+ shielding region junction. This increasing reverse bias will result in an increasing level of depletion of the JFET region 36 until the point of pinch-off, thereby initially inducing a non-linear increase in JFET region resistance followed by current saturation therein. Furthermore, the increasing voltage drop along the JFET region 36 will advantageously result in a lowering of the effective gate voltage between the gate electrode 31 and the source side of the P-base/active region 38, and a concomitant lowering of the saturated current of the MOSFET until it equals the saturated current of the pinched-off depletion-mode JFET.

Figure 6:
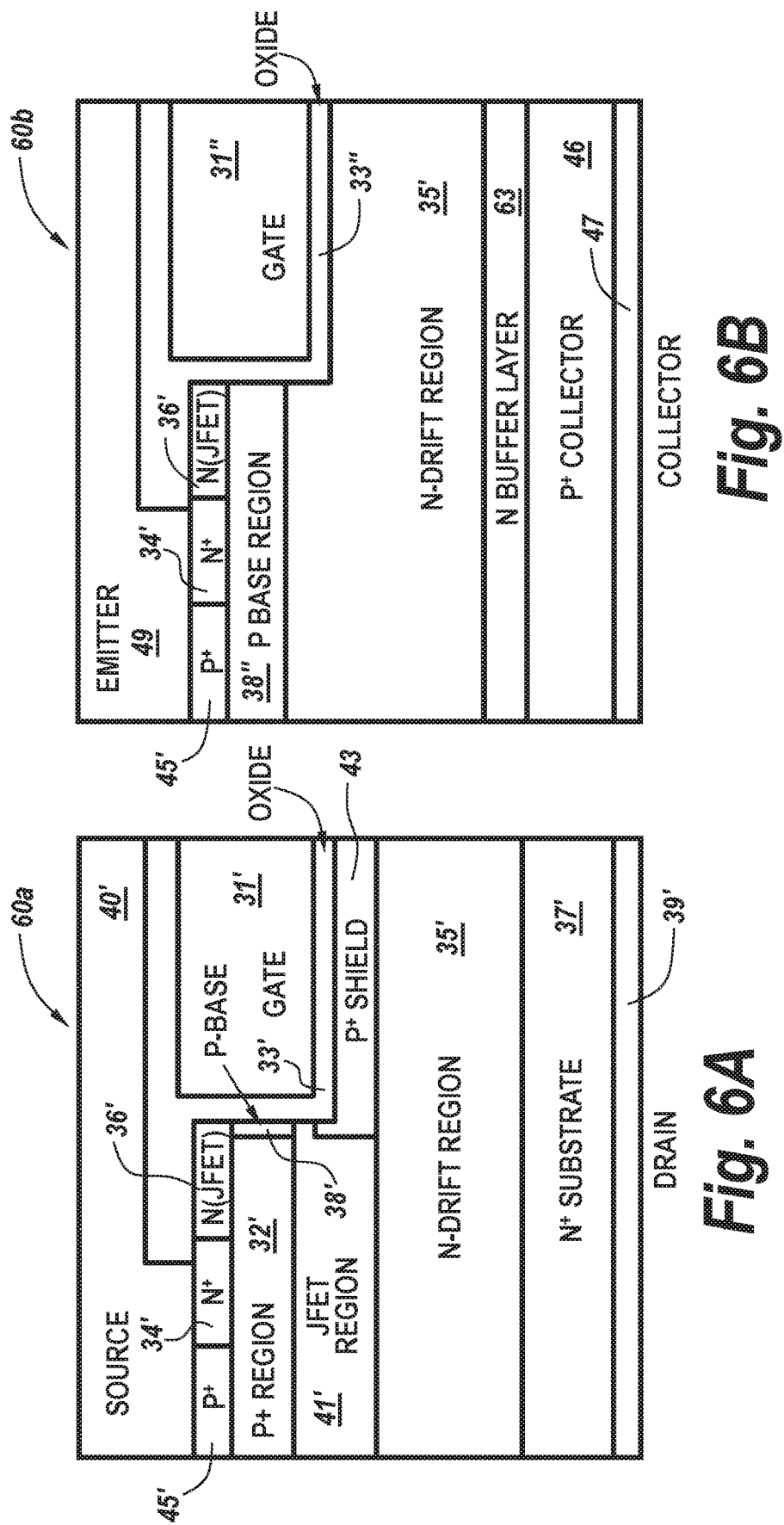
FIG. 6A is a cross-sectional view of a trench-gate SiC MOSFET with an inversion-mode active region and an integrated source-side JFET, according to an embodiment of the invention.
FIG. 6B is a cross-sectional view of a trench-gate silicon IGBT with an inversion-mode active region and an integrated source-side JFET, according to an embodiment of the invention.

Referring now to FIG. 6A, a trench-gate version of the power device 30a of FIG. 3A is illustrated as an inversion-type SiC trench-gate power device 60a with an integrated depletion-mode JFET defined by N-type JFET region 36' and P+ shielding region 32'. As illustrated, this trench-gate power device 60a includes a source electrode 40', which is electrically and ohmically connected to a P+ contact region 45' and N+ source region 34', and a vertical P-type base region 38' that contacts a sidewall of the trench-gate and supports an inversion layer channel (between the N-type JFET region 36' and underlying JFET region 41') during forward on-state conduction. The vertical drift region 35', substrate region '37' and drain 39' are also provided, which correspond to the drain region 35, substrate region 37 and drain electrode 39 of FIG. 3A. Also provided is a lower P+ trench-gate shielding region 43, which protects a lower trench gate 31' and trench gate oxide 33' from high field-induced breakdown.

As described hereinabove with respect to FIG. 3A, the integrated JFET, which is defined by the JFET region 36' (and P+ shielding region 32'), extends to a sidewall of the trench-based insulated gate electrode 31', 33' and advantageously performs a saturation current clamping function, which can substantially increase a short-circuit withstand time ($t_{sc}$) of the power device 60a, but with only a relatively small increase in specific on-resistance ($R_{on,sp}$) and no channel length reduction.

Finally, as shown by FIG. 6B, the design of the SiC power device 60a of FIG. 6A and the saturation current clamping function provided by the integrated depletion-mode JFET can be utilized within a silicon (Si) trench-gate IGBT 60b having a P-type collector region 46 and a collector terminal 47 adjacent a bottom surface of a semiconductor substrate, and an emitter terminal 49 adjacent an upper surface of the semiconductor substrate. Also provided is a P-type base region 38" which extends underneath the source region 34' and the JFET region 36', as illustrated. Like the JFET region 36', the P-type base region 38" extends to a sidewall of the trench-based insulated gate electrode 31", 33". As illustrated, this P-type base region 38" forms a P-N junction with the N-type drift region 35', which contacts an underlying N-type buffer region 63. This N-type buffer layer forms a P-N rectifying junction with an underlying P+ collector region 46, as illustrated, which directly contacts a collector electrode 47.

Figure 7:
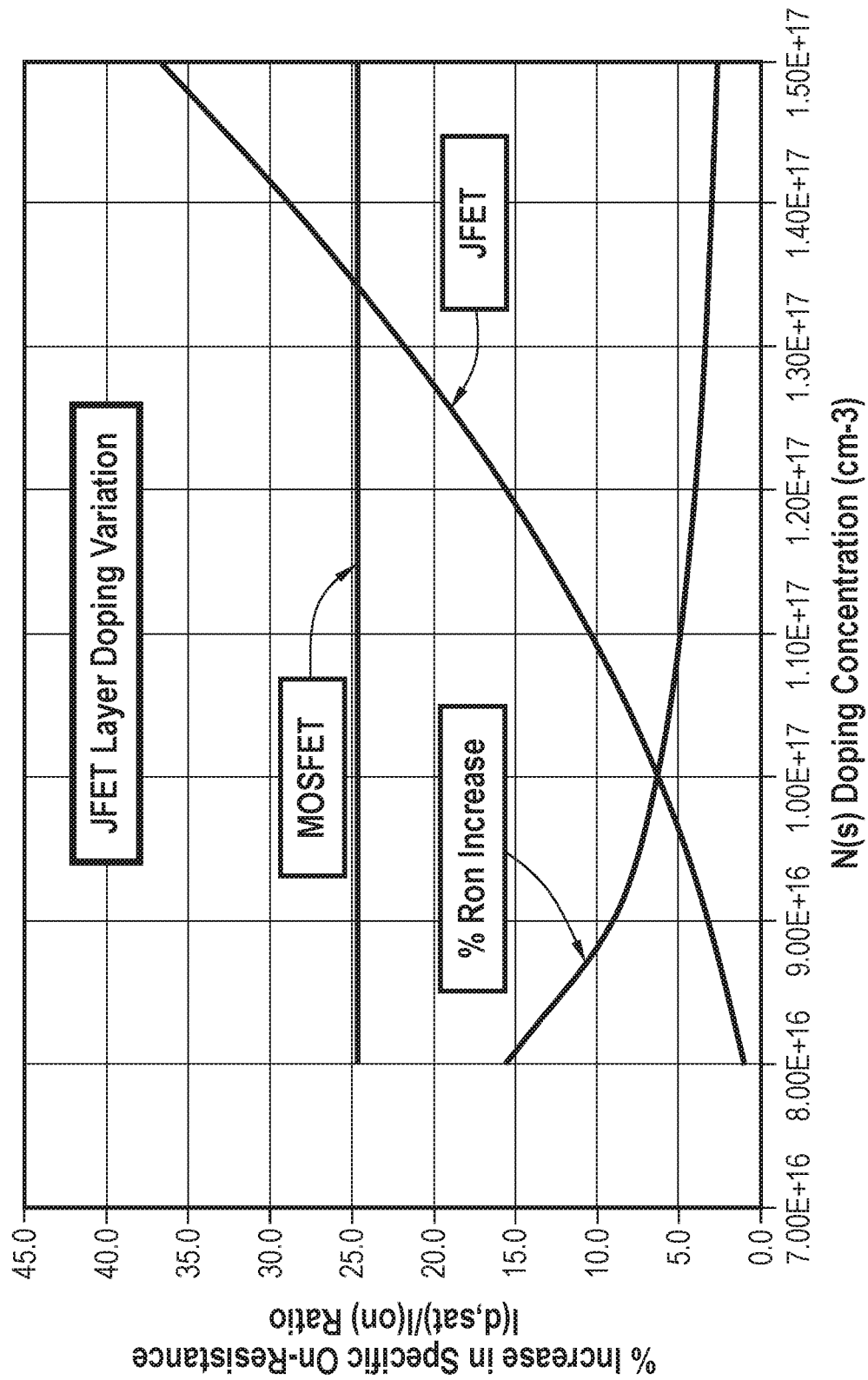
FIG. 7 is a graph illustrating: (i) %-increase in specific on-resistance (for the SiC JFET of FIG. 3A) versus JFET layer doping concentration, and (ii) a ratio of Idsat/Ion (for the SiC JFET of FIG. 3A) versus JFET layer doping concentration, according to an embodiment of the invention.
Figure 8:
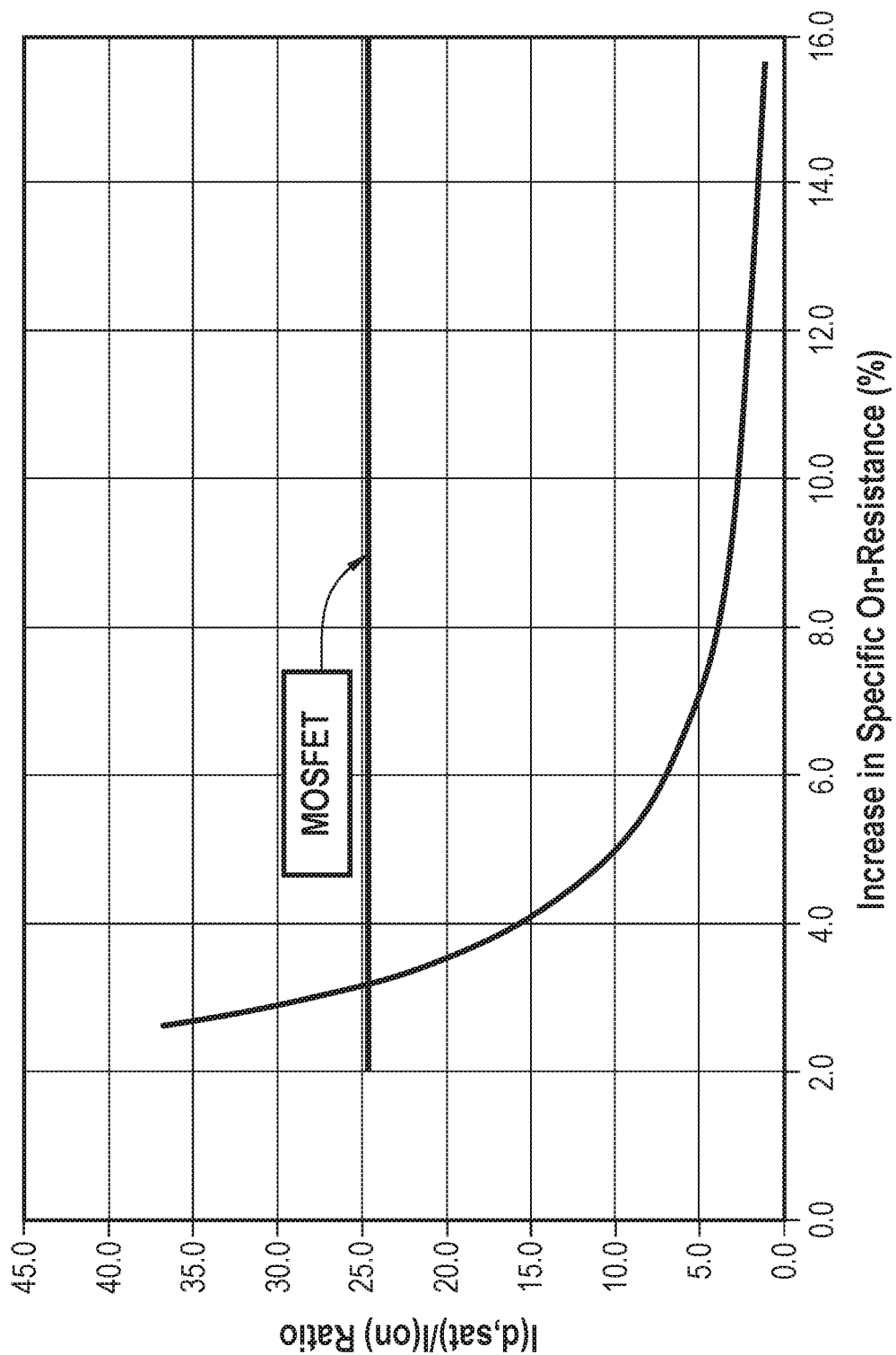
FIG. 8 is a graph illustrating a tradeoff between lowering a ratio of Idsat/Ion (for the SiC JFET of FIG. 3A) versus a %-increase in specific on-resistance, according to an embodiment of the invention.

Referring now to FIG. 7, a graph is provided that illustrates, on the y-axis, a: (i) %-increase in specific on-resistance ($R_{on,sp}$) for the SiC JFET 30a of FIG. 3A, and (ii) a ratio of Idsat/Ion for the SiC JFET of FIG. 3A, versus JFET region/layer 36 doping concentration (x-axis). As shown, at relatively low levels of JFET region doping (e.g., less than about $1.1 \times 10^{17}$ cm$^{-3}$) there is significant increase in specific on-resistance ($R_{on,sp}$) and at relatively high levels of JFET region doping (e.g., greater than about $1.25 \times 10^{17}$ cm$^{-3}$) the saturation current supported by the built-in JFET increases to a level otherwise supported by the SiC MOSFET (in the absence of the built-in JFET), thereby likely precluding meaningful increases in short-circuit withstand time ($t_{sc}$). These highly nonlinear tradeoffs between higher short-circuit withstand time (and higher specific on-resistance) versus lower short-circuit withstand time resulting from a higher ratio of Idsat/Ion (saturated current/on-state current) are further illustrated by FIG. 8, which suggests that careful design of the JFET region 36 is required to obtain a meaningful increase in short-circuit withstand time but without any significant increase in specific on-resistance.

Referring again to the four-terminal power device 100 of FIGS. 4A-4B, the improved short-circuit withstand time for a silicon carbide power MOSFET (or a silicon IGBT) was achieved, but with some potential increase in specific on-state resistance, by utilizing an in-series field effect transistor (FET), such as a junction field effect transistor (JFET), with shorted gate-source terminals so that the gate-to-source voltage (Vgs) of the FET would be held at a fixed voltage potential (e.g., 0 Volts) and a minimal number of controllable device terminals would be required in a packaged device. However, as described hereinbelow, an in-series FET, such as a JFET or a depletion-mode MOSFET or an enhancement-mode MOSFET, for example, may be provided and driven with a non-zero gate-to-source DC voltage to thereby achieve an enhancement in short circuit withstand capability, which can be user-programmable in some embodiments of the invention. This non-zero DC voltage may be applied by a programmable DC voltage source to a gate of the in-series FET, which may be electrically connected to a corresponding terminal of a packaged device containing both the SiC power MOSFET (or Si IGBT) and the in-series FET.

For example, a depletion-mode or an enhancement-mode MOSFET (e.g., Si MOSFET) may be provided as an in-series FET, but with an adjustable gate-to-source DC voltage that supports the tuning of the short-circuit withstand capability. Advantageously, the gate-to-source voltage may be chosen by an end user (e.g., application engineer) of the SiC power MOSFETs or the Si IGBTs, and not exclusively by the device supplier. This added functionality makes these devices essentially "user programmable/tunable" to achieve an application-specific balance between a desired short-circuit withstand time and an acceptable specific on-state resistance. Fortunately, the use of a non-zero DC gate voltage to achieve an increase in short-circuit withstand time requires no synchronization between: (i) the gate drive control voltage for a SiC power MOSFET (or a Si IGBT), and (ii) the fixed DC gate drive voltage for the in-series depletion-mode or enhancement-mode Si MOSFET.

Figure 9A:
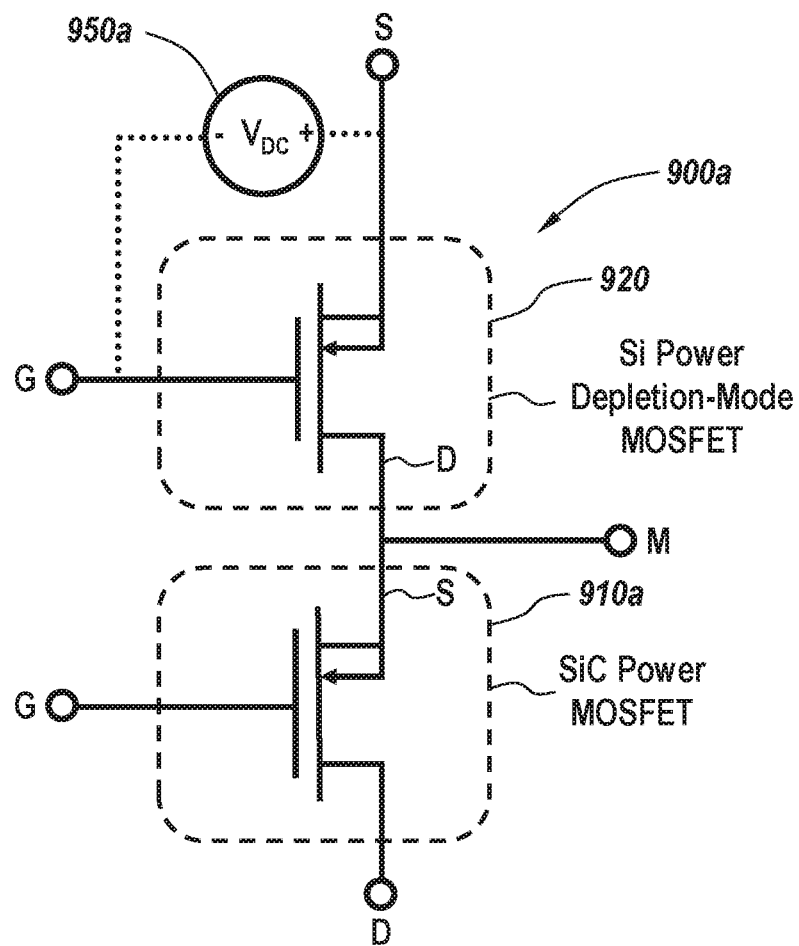
FIG. 9A is an electrical schematic of a power device containing a silicon-carbide (SiC) power MOSFET in series with a depletion-mode power MOSFET responsive to an applied negative gate-to-source DC bias, according to an embodiment of the invention, where "S", "G", "M" and "D" represent source, gate, monitor and drain terminals, respectively.
Figure 9B:
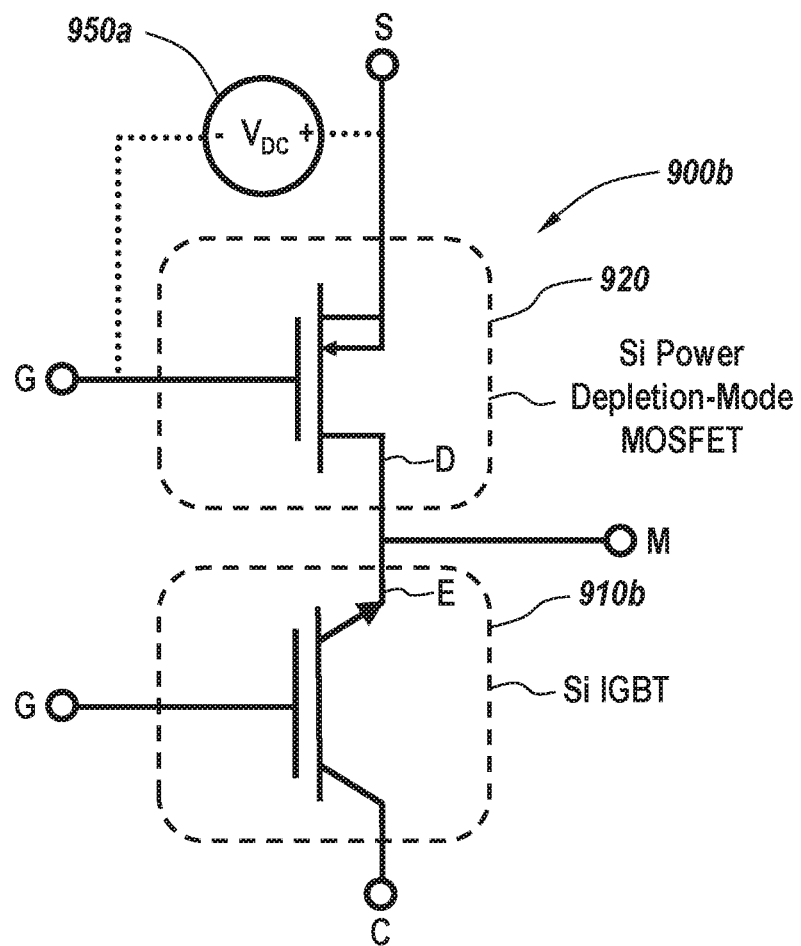
FIG. 9B is an electrical schematic of a power device containing a silicon insulated-gate bipolar transistor (IGBT) in series with a depletion-mode power MOSFET responsive to an applied negative gate-to-source DC bias, according to an embodiment of the invention, where "S", "G", "D", "E", "M" and "C" represent source, gate, drain, emitter, monitor and collector terminals, respectively.

Accordingly, as illustrated by the power devices 900a, 900b of FIGS. 9A-9B, a SiC power MOSFET 910a or a Si IGBT 910b can be electrically coupled in-series with a Si depletion-mode power MOSFET 920, to yield a composite power device having five (5) terminals, where the abbreviations "S", "G", "D", "E", "C" and "M" represent: a source, a gate, a drain, an emitter, a collector and a monitor terminal, respectively. As described hereinabove with respect to FIGS. 4A-4B, the monitor terminal (M) can be utilized by external monitoring and control circuitry (not shown) to rapidly detect an occurrence of a short-circuit event. This is because a short-circuit event may be evidenced by a rapid change in a voltage at an intermediate node (D-to-S, or D-to-E) to which the monitor terminal M is connected.

According to some of these embodiments of the invention, the MOSFET 920 can have a relatively low voltage rating of about 30V because it is provided within the gate drive loop for the SiC power MOSFET 910a (or Si IGBT 910b), which typically has a maximum gate drive voltage of about 20V. As shown, a "user programmable" negative gate bias can be applied to the Si depletion-mode MOSFET 920 by an external DC voltage source 950a, to thereby reduce the saturation current within the power devices 900a, 900b at higher drain/collector voltages, and advantageously cause an increase in the short-circuit withstand time as described hereinabove. Nonetheless, this application of a negative gate-to-source bias ($V_{DC}$) will typically cause an increase the on resistance of the Si depletion-mode MOSFET 920 and a concomitant increase in the overall on-state resistance of the composite power device 900a, 900b.

Figure 10A:
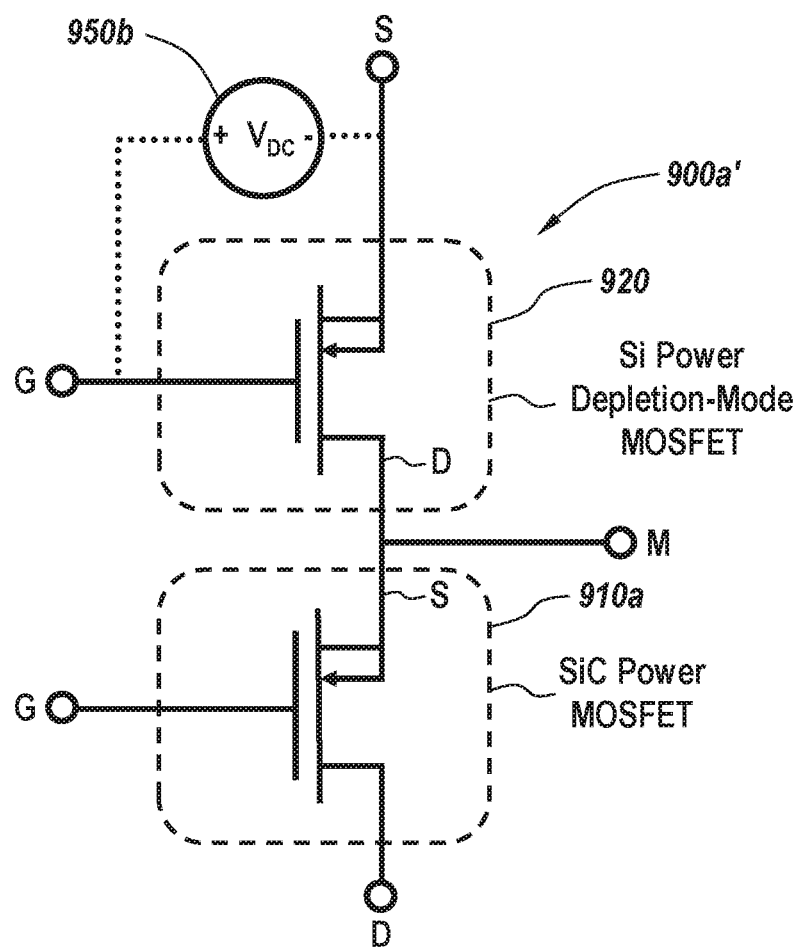
FIG. 10A is an electrical schematic of a power device containing a silicon-carbide (SiC) power MOSFET in series with a depletion-mode power MOSFET responsive to an applied positive gate-to-source DC bias, according to an embodiment of the invention, where "S", "G", "M" and "D" represent source, gate, monitor and drain terminals, respectively.
Figure 10B:
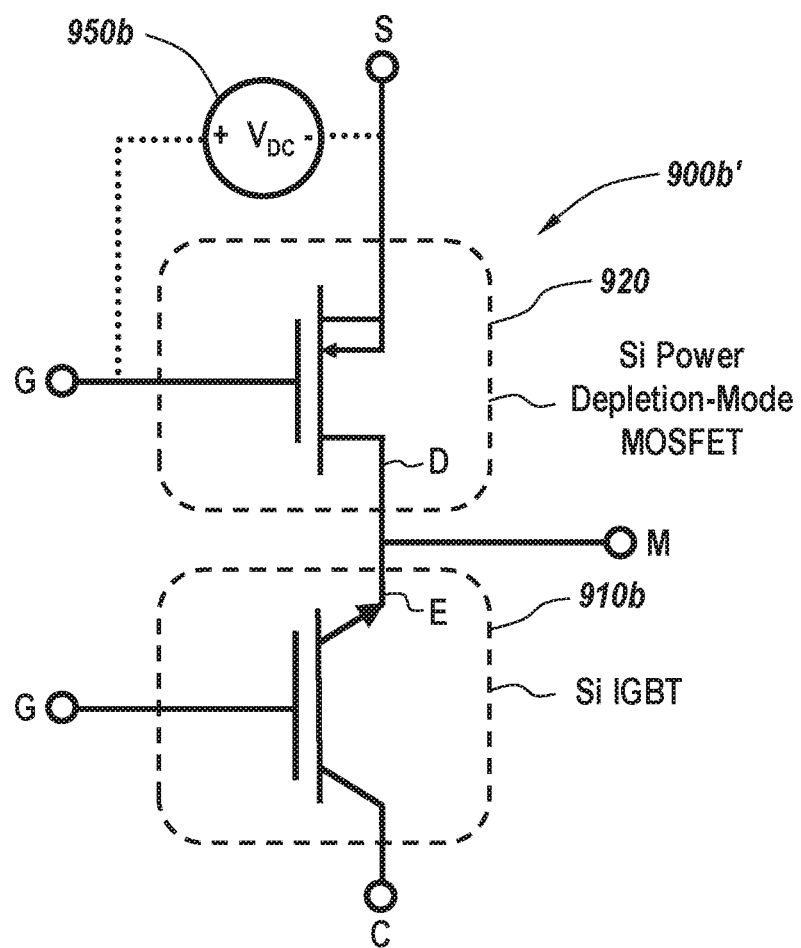
FIG. 10B is an electrical schematic of a power device containing a silicon insulated-gate bipolar transistor (IGBT) in series with a depletion-mode power MOSFET responsive to an applied positive gate-to-source DC bias, according to an embodiment of the invention, where "S", "G", "D", "E", "M" and "C" represent source, gate, drain, emitter, monitor and collector terminals, respectively.
Figure 11A:
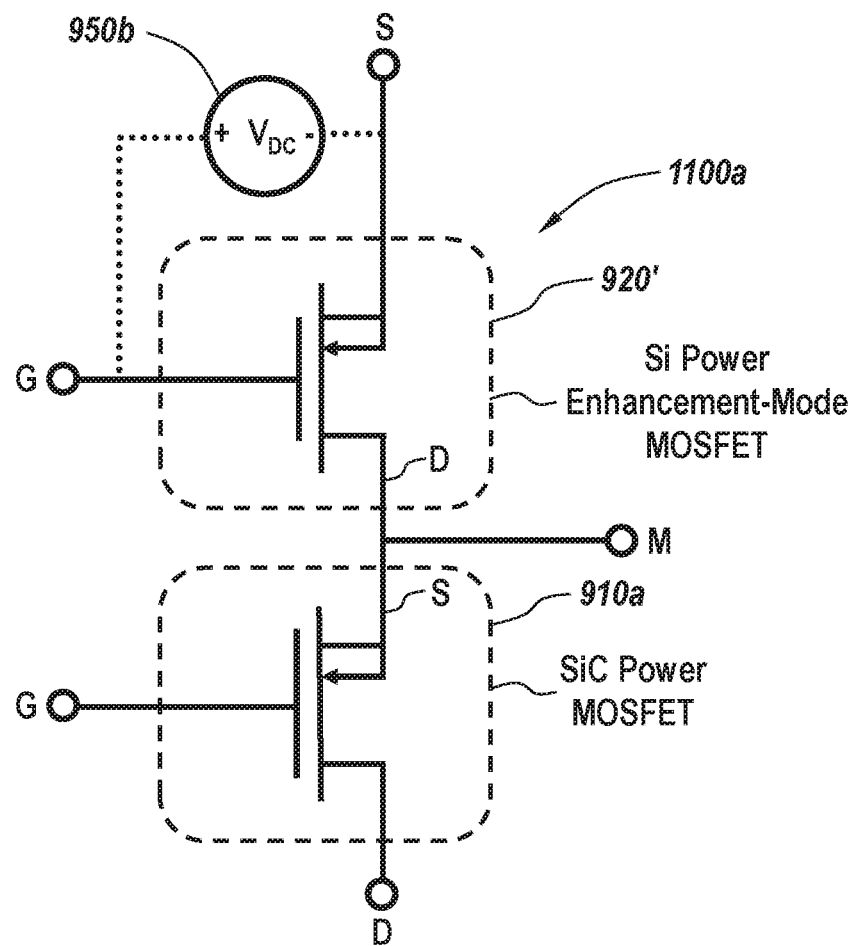
FIG. 11A is an electrical schematic of a power device containing a silicon-carbide (SiC) power MOSFET in series with an enhancement-mode power MOSFET responsive to an applied positive gate-to-source DC bias, according to an embodiment of the invention, where "S", "G", "M" and "D" represent source, gate, monitor and drain terminals, respectively.
Figure 11B:
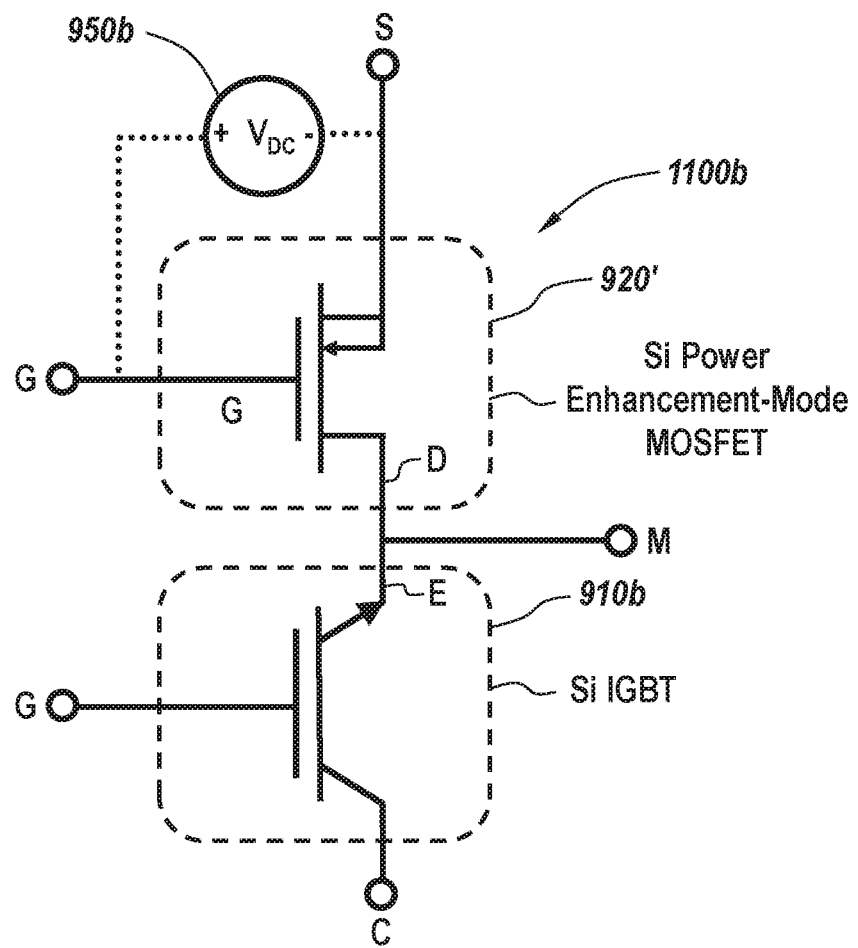
FIG. 11B is an electrical schematic of a power device containing a silicon insulated-gate bipolar transistor (IGBT) in series with an enhancement-mode power MOSFET responsive to an applied positive gate-to-source DC bias, according to an embodiment of the invention, where "S", "G", "D", "E", "M" and "C" represent source, gate, drain, emitter, monitor and collector terminals, respectively.

Alternatively, as shown by the power devices 900a', 900b' and external DC voltage source 950b of FIGS. 10A-10B, the application of a positive gate-to-source bias ($V_{DC}$) to the Si depletion-mode MOSFET 920 can be utilized to cause an increase in the saturation current at higher drain voltages; however, such an increase will result in a decrease in short-circuit withstand time stemming from an increase in power dissipation. Nonetheless, the application of a positive gate bias can be utilized to achieve a reduction in the on resistance of the Si depletion-mode MOSFET 910a or Si IGBT 910b, and corresponding power device 900a', 900b'. Next, as shown by the power devices 1100a, 1100b and external DC voltage source 950b of FIGS. 11A-11B, a Si enhancement-mode MOSFET 920' can be substituted for the depletion-mode MOSFET 920 of FIGS. 10A-10B, and a positive gate-to-source bias ($V_{DC}$) can be applied thereto to set a desired saturation current level at higher drain voltages and achieve a desired inverse relationship between saturation current and short-circuit withstand time.

Figure 12:
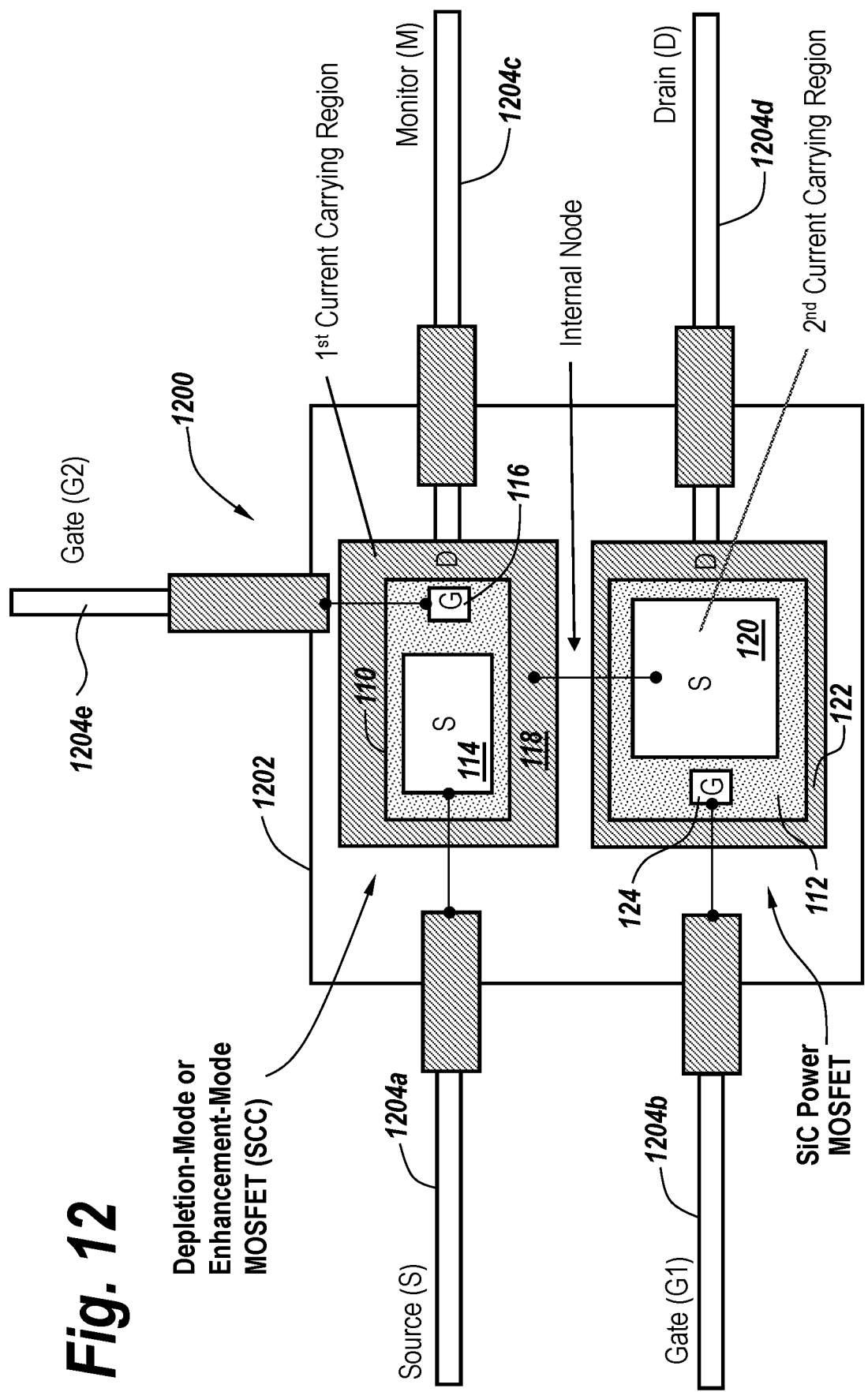
FIG. 12 is plan view of a 5-terminal packaged power device containing a silicon-carbide (SiC) power MOSFET in series with a Si MOSFET (depletion-mode or enhancement-mode), which operates as a saturation current clamp (SCC) according to an embodiment of the invention.

FIG. 12 is plan view of a 5-terminal packaged power device 1200 containing a silicon-carbide (SiC) power MOSFET in series with a Si MOSFET (depletion-mode or enhancement-mode), which operates as a saturation current clamp (SCC) according to an embodiment of the invention. As shown, this power device 1200 may be provided using two discrete and serially-connected devices (e.g., Si MOSFET (SCC), SiC MOSFET), which may be assembled together within a semiconductor package 1202, or possibly separate packages. As shown, the two discrete devices may be configured together to provide a power device 1200 having: (i) two current carrying terminals 1204a, 1204d corresponding to the source (S) of the Si MOSFET (SCC) and drain (D) of the SiC MOSFET, (ii) a first control terminal 1204b corresponding to the gate (G1) of the SiC MOSFET, (iii) a second control terminal 1204e corresponding to the gate (G2) of the Si MOSFET, and (iv) one monitor terminal (M) 1204c, which can be utilized by external monitoring and control circuitry (not shown) to rapidly detect an occurrence of a short-circuit event, which can be evidenced by a rapid change in a voltage at an internal node (D-to-S node) to which the monitor terminal 1204c is connected.

In particular, the power device 1200 of FIG. 12 is illustrated as a five (5) (or more) terminal package 1202 containing a pair of semiconductor chips 110, 112, which are bonded to underlying drain electrodes 118, 122 within the package 1202. As shown, the drain electrodes 118, 122 of the Si MOSFET and SiC MOSFET are respectively coupled by a first pin, which operates as a monitor terminal 1204c of the power device 1200, and a second pin, which operates as a current-carrying "drain" terminal 1204d of the SiC MOSFET. The drain electrode 118 of the Si MOSFET is also internally shorted to a source electrode 120 of the SiC MOSFET. The source electrode 114 and gate electrode 116 of the Si MOSFET are respectively connected to third and fourth pins of the package 1202, which operate as a current carrying "source" terminal 1204a and the second control terminal 1204e of the power device 1200, respectively. Finally, the gate electrode 124 of the SiC MOSFET is connected to a fifth pin of the package 1202, which operates as the first control terminal 1204b of the power device 1200.

Figure 13:
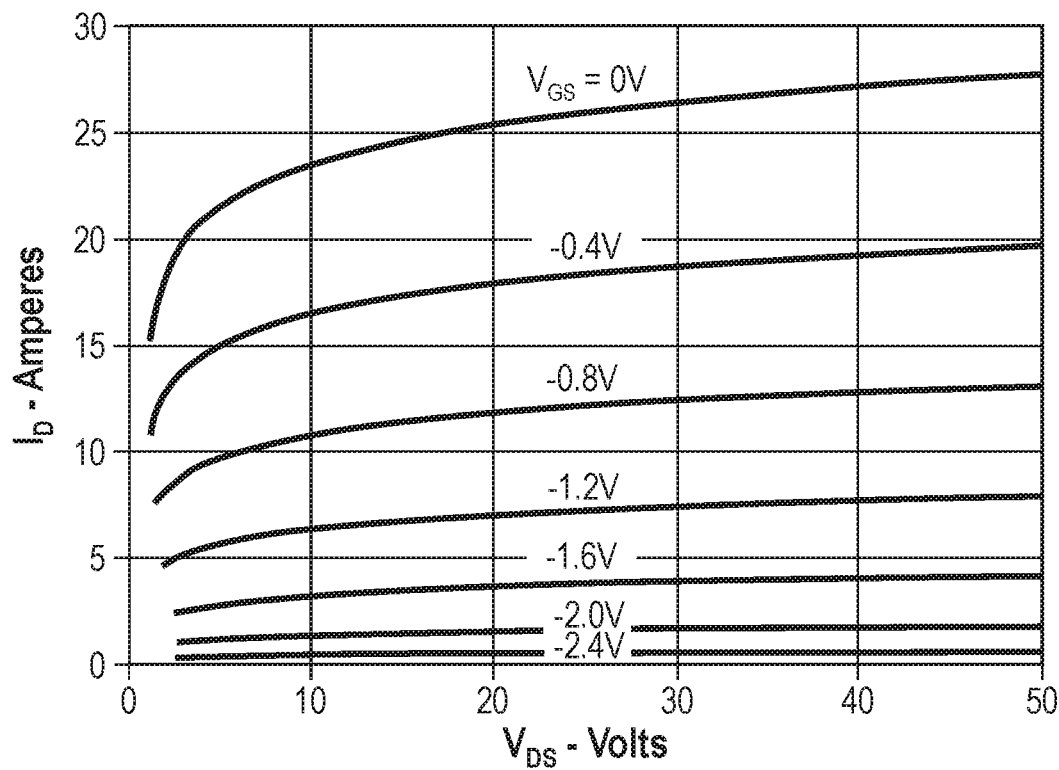
FIG. 13 is a graph of drain current ($I_D$) versus drain-to-source voltage ($V_{DS}$) for a silicon depletion-mode power MOSFET, at various negative DC gate biases ($-2.4 \leq V_{GS} \leq 0$).
Figure 14:
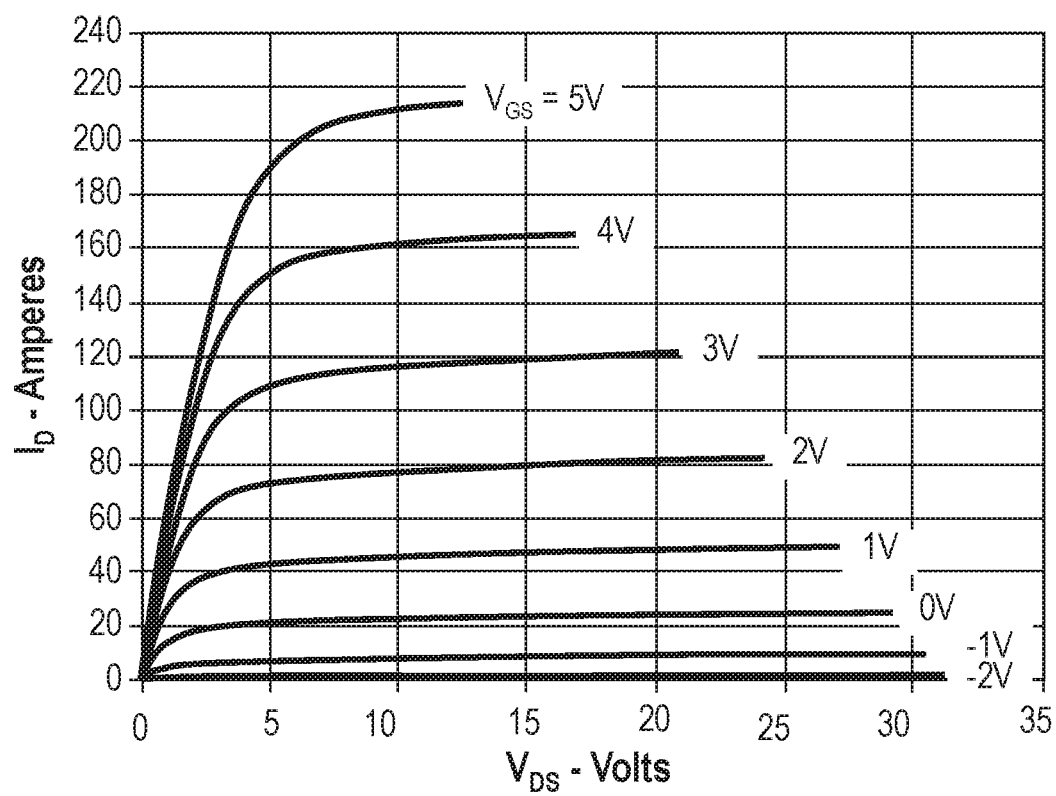
FIG. 14 is a graph of drain current ($I_D$) versus drain-to-source voltage ($V_{DS}$) for a silicon depletion-mode power MOSFET, at various positive DC gate biases ($-2 \leq V_{GS} \leq 5$).

Referring now to FIG. 13, the $I_D$-$V_{DS}$ characteristics of a Si depletion-mode MOSFET (e.g., IXTT16N10D2 100V) at various negative DC gate bias voltages are illustrated. As shown, a fixed DC gate bias of −0.4 V decreases the saturation current from about 25 A (at $V_{GS}$=0) to about 18 A. This allows a reduction of the short-circuit current for both the SiC power MOSFET embodiment of FIG. 9A and the Si IGBT embodiment of FIG. 9B, which yields an increase in short-circuit withstand time as described hereinabove. In contrast, the $I_D$-$V_{DS}$ characteristics of a Si depletion-mode MOSFET (e.g., IXTT16N10D2 100V) at various positive DC gate bias voltages are illustrated by FIG. 14. As shown, a fixed DC gate bias of +1.0V increases the saturation current from about 25 A (at $V_{GS}$=0) to about 45 A, which allows for a reduction in on-resistance while making the short-circuit current larger for both the SiC power MOSFET 910a of FIG. 10A and the Si IGBT 910b of FIG. 10B, but yields a decrease in short-circuit withstand time.

Figure 15:
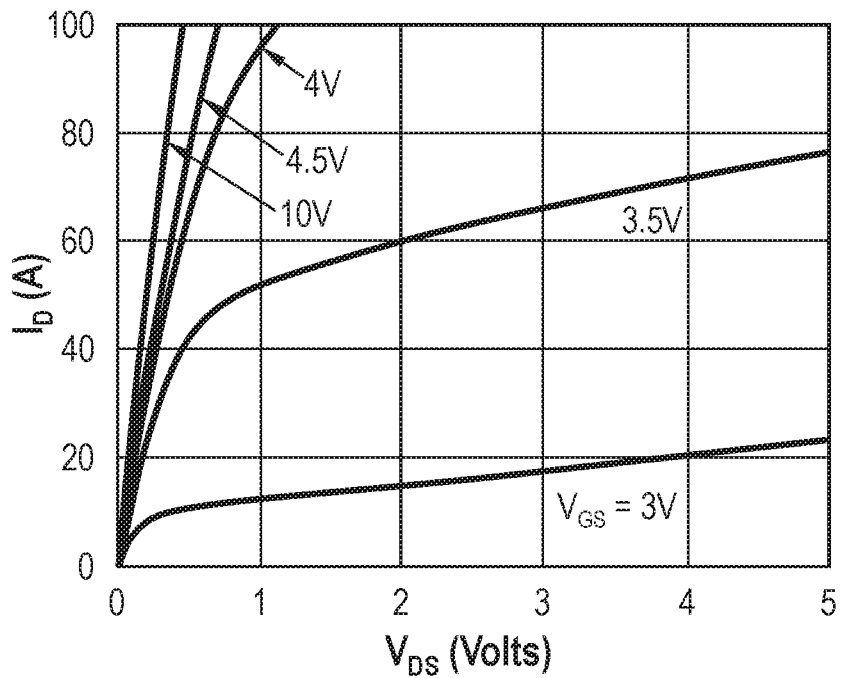
FIG. 15 is a graph of drain current ($I_D$) versus drain-to-source voltage ($V_{DS}$) for a silicon enhancement-mode power MOSFET, at various positive DC gate biases ($3 \leq V_{GS} \leq 10$).
Figure 16:
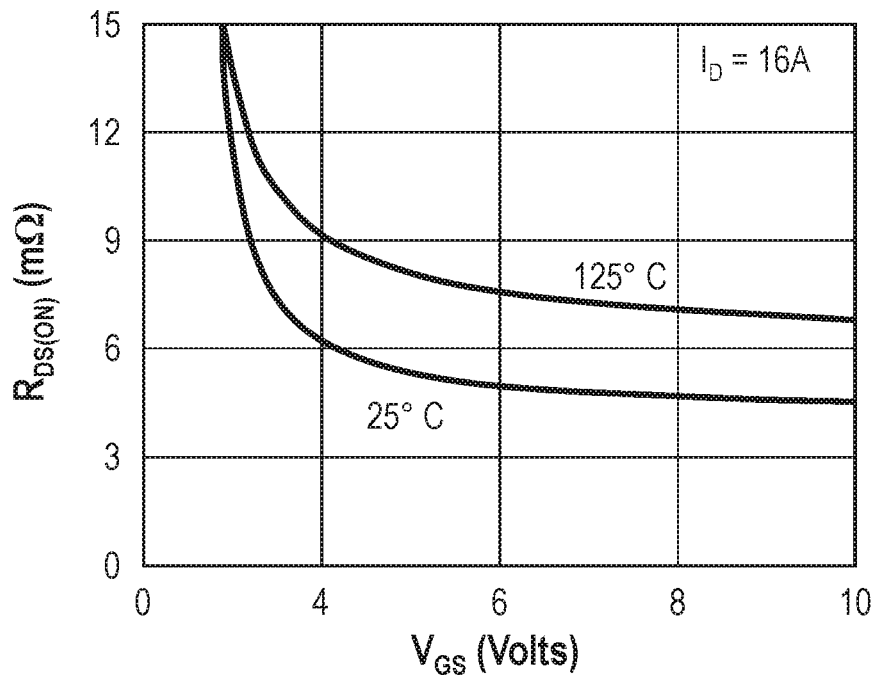
FIG. 16 is a graph of drain-to-source on-resistance ($R_{DS(ON)}$) versus gate-to-source ($V_{GS}$) for a silicon enhancement-mode power MOSFET.

Referring now to FIG. 15, the $I_D$-$V_{DS}$ characteristics of an enhancement-mode Si power MOSFET (e.g., AOSP32368 30V) with positive DC gate bias voltages are provided. As shown, a DC gate bias of about +3.25 V can be used to obtain a saturation current of about 40 A. And, as illustrated by FIG. 16, the on-resistance of the Si power MOSFET characterized by FIG. 15 is only about 9 mΩ at a gate bias of about 3.25 Volts, which supports a reduction in the short-circuit current for the power devices 1100a, 1100b of FIGS. 11A-11B, and an increase in short-circuit withstand time with relatively small increase in overall on-state resistance.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A power device, comprising:
a semiconductor switch having a control terminal, first and second current carrying terminals, and a saturation current clamp electrically coupled in series between the first current carrying terminal and a current carrying semiconductor active region of the semiconductor switch, which extends opposite the control terminal and has a conductivity modulated by a control terminal bias applied to the control terminal said saturation current clamp configured to clamp a maximum series current through the first and second current carrying terminals of said semiconductor switch at a level below a maximum saturation current supported by the semiconductor active region.

2. The power device of claim 1, wherein the saturation current clamp comprises a field effect transistor having a shorted gate and source terminals.

3. The power device of claim 2, wherein the saturation current clamp comprises a material selected from a group consisting of silicon, silicon carbide, gallium arsenide and gallium nitride.

4. The power device of claim 1, wherein the saturation current clamp comprises a semiconductor device selected from a group consisting of depletion-mode JFETs, depletion-mode MESFETs and depletion-mode MOSFETs; and wherein the gate and source terminals of the semiconductor device are shorted together.

5. The power device of claim 1, wherein said semiconductor switch comprises a device selected from a group consisting of planar-gate MOSFETs, trench-gate MOSFETs, planar-gate IGBTs and trench-gate IGBTs.

6. The power device of claim 1, wherein the saturation current clamp is configured to clamp a maximum current through said semiconductor switch at a level between 10% and 70% of a maximum saturation current supported by the semiconductor active region.

7. The power device of claim 6, wherein said semiconductor switch comprises a device selected from a group consisting of planar-gate inversion-mode silicon carbide MOSFETs, planar-gate accumulation-mode silicon carbide MOSFETs, trench-gate silicon carbide MOSFETs, planar-gate IGBTs and trench-gate IGBTs.

8. The power device of claim 7, wherein said semiconductor switch is packaged as a four terminal device comprising two current-carrying terminals, one gate terminal and one voltage-monitoring terminal.

9. The power device of claim 1, wherein the semiconductor active region is a gate-modulated active region.

10. The power device of claim 1, wherein the saturation current clamp comprises an enhancement-mode MOSFET.

11. The power device of claim 1, wherein the semiconductor active region is configured to support an inversion-layer channel for the maximum series current.

12. The power device of claim 1, wherein the semiconductor active region is configured to support an accumulation-layer channel for the maximum series current.

13. The power device of claim 1, wherein the saturation current clamp has a non-linear resistance characteristic sufficient to increase a short-circuit withstand time of a transistor comprising the semiconductor active region.

14. The power device of claim 1, wherein the saturation current clamp has a non-linear resistance characteristic sufficient to increase a short-circuit withstand time of a wide bandgap power transistor comprising the semiconductor active region.

15. A power device, comprising:
a packaged semiconductor switch comprising first and second series-connected insulated-gate transistors, first and second control terminals electrically connected to the first and second insulated-gate transistors, respectively, first and second current carrying terminals electrically connected to the first and second insulated-gate transistors, respectively, and a voltage-monitoring terminal electrically connected to an internal node shared by first and second current carrying regions within the first and second insulated-gate transistors, respectively; and
wherein the first insulated-gate transistor is configured to clamp a maximum current through the second insulated-gate transistor at a level between 10% and 70% of a maximum saturation current supported by the second insulated-gate transistor when the maximum current is flowing in series through the first and second current carrying terminals.

16. The power device of claim 15, wherein the first and second control terminals are electrically connected to a gate of the first insulated-gate transistor and a gate of the second insulated-gate transistor, respectively.

17. The power device of claim 16, wherein the first and second current carrying terminals are electrically connected to a source of the first insulated-gate transistor and a drain or collector of the second insulated-gate transistor.

18. The power device of claim 17, wherein the voltage-monitoring terminal is electrically connected to a drain of the first insulated-gate transistor and a source or emitter of the second insulated-gate transistor.

19. The power device of claim 15, wherein the first insulated-gate transistor is selected from a group consisting of depletion-mode and enhancement-mode MOSFETs.

20. The power device of claim 15, wherein the first and second series-connected insulated-gate transistors are packaged within a single semiconductor package.

* * * * *